(12) United States Patent
Tsai et al.

(10) Patent No.: US 12,227,867 B2
(45) Date of Patent: Feb. 18, 2025

(54) PLATING APPARATUS FOR PLATING SEMICONDUCTOR WAFER AND PLATING METHOD

(71) Applicant: Taiwan Semiconductor Manufacturing Company, Ltd., Hsinchu (TW)

(72) Inventors: Chen-Yu Tsai, Taoyuan (TW); Ku-Feng Yang, Hsinchu County (TW); Wen-Chih Chiou, Miaoli County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/152,089

(22) Filed: Jan. 9, 2023

(65) Prior Publication Data
US 2023/0142163 A1    May 11, 2023

Related U.S. Application Data

(63) Continuation of application No. 17/137,267, filed on Dec. 29, 2020, now Pat. No. 11,585,008.

(51) Int. Cl.
| | |
|---|---|
| C25D 21/04 | (2006.01) |
| C25D 7/12 | (2006.01) |
| C25D 17/00 | (2006.01) |
| C25D 17/08 | (2006.01) |
| C25D 21/10 | (2006.01) |
| H01L 21/768 | (2006.01) |

(52) U.S. Cl.
CPC ............ *C25D 21/04* (2013.01); *C25D 7/123* (2013.01); *C25D 17/001* (2013.01); *C25D 17/08* (2013.01); *C25D 21/10* (2013.01); *H01L 21/7684* (2013.01); *H01L 21/76898* (2013.01)

(58) Field of Classification Search
CPC ........................ C25D 7/12–123; C25D 17/001; C25D 21/04; H01L 21/2885; H01L 21/76873
See application file for complete search history.

(56) References Cited

U.S. PATENT DOCUMENTS

2003/0057098 A1*  3/2003  Sendai ................... C25D 17/02
257/E21.585

OTHER PUBLICATIONS

Tuan Tran et al., "Air entrainment during impact of droplets on liquid surfaces", Journal of Fluid Mechanics, Jun. 2013, pp. 1-11.

* cited by examiner

*Primary Examiner* — Hosung Chung
(74) *Attorney, Agent, or Firm* — JCIPRNET

(57) ABSTRACT

A plating apparatus includes a workpiece holder, a plating bath, and a clamp ring. The plating bath is underneath the workpiece holder. The clamp ring is connected to the workpiece holder. The clamp ring includes channels communicating an inner surface of the clamp ring and an outer surface of the clamp ring.

20 Claims, 20 Drawing Sheets

PLATING APPARATUS FOR PLATING SEMICONDUCTOR WAFER AND PLATING METHOD

CROSS-REFERENCE TO RELATED APPLICATION

This application is a continuation application of and claims the priority benefit of a prior application Ser. No. 17/137,267, filed on Dec. 29, 2020. The entirety of the above-mentioned patent application is hereby incorporated by reference herein and made a part of this specification.

BACKGROUND

In the production of advanced semiconductor integrated circuits (ICs), electroplated copper is currently used because copper has a lower electrical resistivity and a higher current carrying capacity. However, the copper electroplating process may produce conductive features with defects. For example, nano-bubbles trapped in the electroplated copper layer will limit the quality of the conductive features and therefore reduce production yield of the IC product. Accordingly, forming defect-free conductive features is one of the ongoing efforts in order to improve electrical performance of IC devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
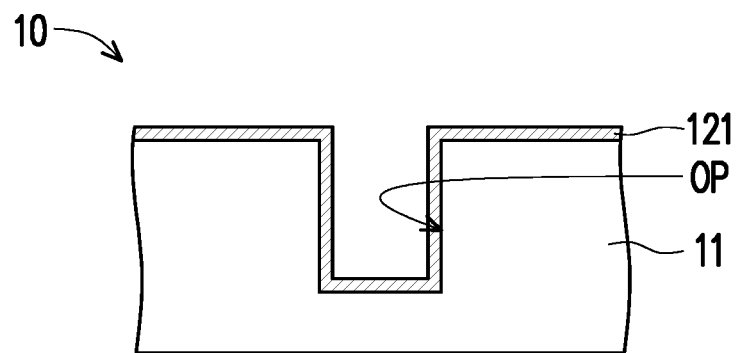
FIG. 1A to FIG. 1D are schematic cross-sectional views illustrating various stages of forming a conductive feature of a semiconductor structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1D are schematic cross-sectional views illustrating various stages of forming a conductive feature 12 on a semiconductor structure 10 in accordance with some embodiments of the disclosure. Referring to FIG. 1A, a base layer 11 of a semiconductor structure 10 is provided with an opening OP. Moreover, a seed material layer 121 is formed on the base layer 11 in a conformal manner. In some embodiments, the base layer 11 is a semiconductor wafer (e.g., silicon wafer) or is part of a semiconductor wafer. For example, the base layer 11 includes a semiconductor substrate, such as a bulk semiconductor or the like, which may be doped or undoped. Under this scenario, the subsequently formed conductive feature 12 (shown in FIG. 1D) may act as a through substrate via (TSV) in the semiconductor structure 10. However, the disclosure is not limited thereto. In some alternative embodiments, the base layer 11 is a dielectric layer formed over a semiconductor substrate. Under this scenario, the conductive feature 12 (shown in FIG. 1D) may be formed as a part of interconnect circuitry in the semiconductor structure 10.

In some embodiments, the opening OP is formed by acceptable removal techniques (e.g., lithography and etching, drilling, and/or the like). The depth of the opening OP may range from about 1 μm to about 100 μm. Although the opening OP is illustrated as not penetrating through the base layer 11 in FIG. 1A, the disclosure is not limited thereto. In some alternative embodiments, the opening OP may penetrate through the base layer 11 to expose element(s) underneath the base layer 11. It should be noted that the cross-sectional shape of the opening OP in FIG. 1A is merely an example, and a dual damascene opening including a via hole connecting a trench may be formed in the base layer 11 according to some alternative embodiments.

In some embodiments, a material of the seed material layer 121 includes Cu, Ni, Co, Ru, a combination thereof, etc. For example, the seed material layer 121 may include the same conductive material (e.g., Cu) as that used in the subsequent plating process. In some embodiments, the opening OP is initially lined with a barrier liner (not shown), and then the seed material layer 121 is deposited on the barrier liner. The barrier liner may bond the conductive material to the base layer 11 (e.g., the dielectric layer) or may prevent interaction between the conductive material and the base layer 11 (e.g., silicon substrate). In some embodiments, a material of the barrier liner includes Ta, TaN, Ti, TiN, or a combination thereof.

Figure 1B:
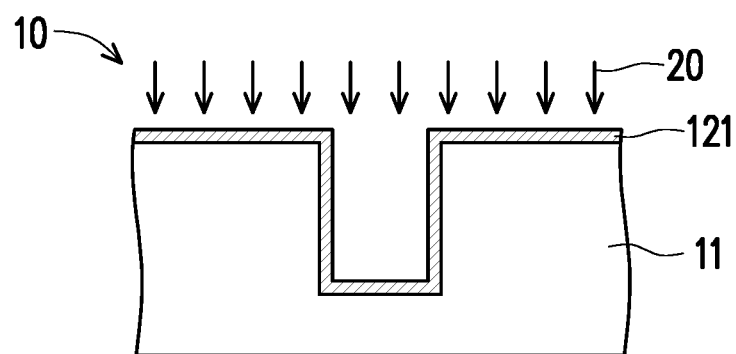

Referring to FIG. 1B, a pre-wetting process 20 is performed on the semiconductor structure 10. For example, the seed material layer 121 is treated with the pre-wetting process 20 to increase wetting ability. The wettability of the seed material layer 121 may be critical for the subsequent plating process. If the seed material layer 121 cannot wet the plating fluid, no plated material can be deposited on that area of the seed material layer 121, thereby forming defects. The pre-wetting process 20 may involve wetting the semiconductor structure 10 with fluids.

Figure 1C:
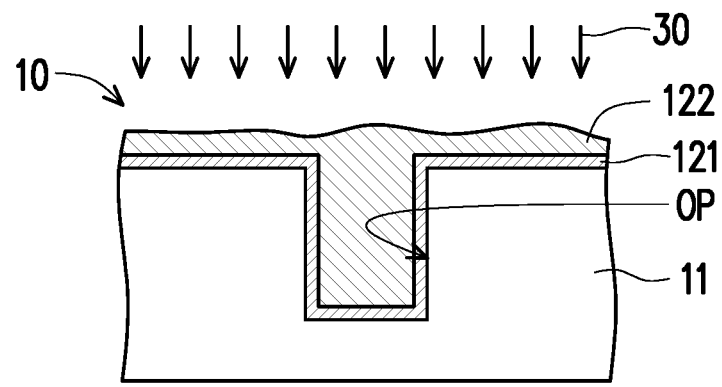

Referring to FIG. 1C, a conductive material layer 122 is formed on the seed material layer 121 through a plating process 30. The conductive material layer 122 may be a metallic material including a metal or a metal alloy such as copper, silver, gold, tungsten, cobalt, aluminum, or alloys thereof. In some embodiments, the plating process 30 includes electrochemical plating (ECP) or the like. For example, after the pre-wetting process 20, ECP is performed to fill the opening OP with the conductive material layer 122. In some cases, undesirable air bubbles may generate during the plating process 30. These air bubbles may be located in the opening OP to create blocking spots and inhibit the conductive material layer 122 from forming on these blocking spots. A plating apparatus 40 (shown in FIG. 4) and the plating process 30 (shown in FIG. 3) which may remove the air bubbles will be described later.

Figure 1D:
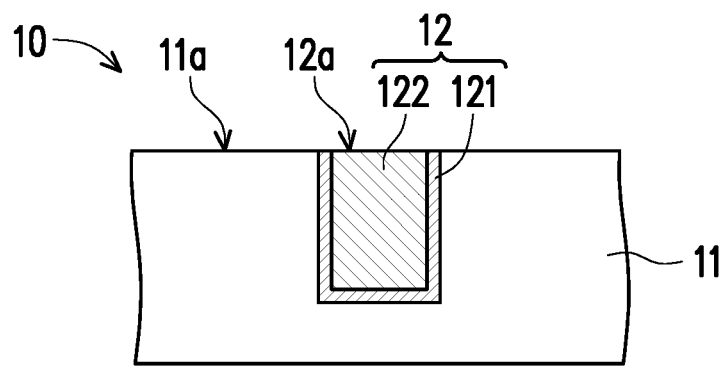

Referring to FIG. 1D, the excess material of the conductive material layer 122 and the seed material layer 121 formed over a major surface 11a of the base layer 11 is removed to form the semiconductor structure 10 having the conductive feature 12 embedded in the base layer 11. For example, the remaining seed material layer 121 and the remaining conductive material layer 122 are collectively referred to as the conductive feature 12. In some embodiments, a planarization (e.g., chemical mechanical polishing, etching, grinding, a combination thereof, etc.) is performed to remove the excess material. In some embodiments, after the planarization, surfaces of the conductive material layer 122 and the seed material layer 121 form a major surface 12a of the conductive feature 12. As illustrated in FIG. 1D, the major surface 12a of the conductive feature 12 is substantially level with the major surface 11a of the base layer 11. In some embodiments, the barrier liner formed between the base layer 11 and the seed material layer 121 is also removed by the planarization.

Figure 2:
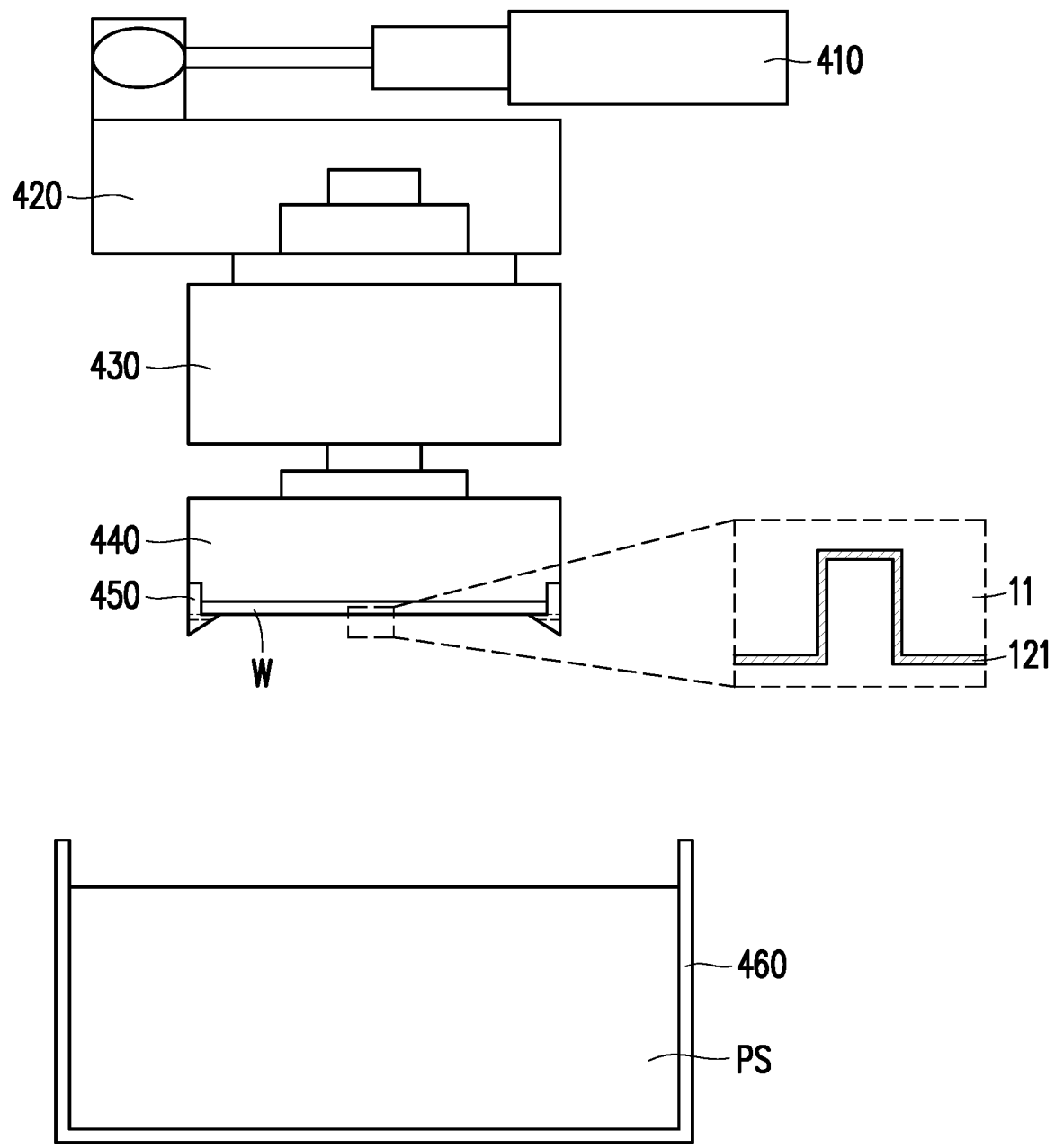
FIG. 2 is a schematic cross-sectional view illustrating a plating apparatus in accordance with some embodiments of the disclosure.

FIG. 2 is a schematic cross-sectional view illustrating a plating apparatus 40 in accordance with some embodiments of the disclosure. Referring to FIG. 2, the plating apparatus 40 includes a tilting mechanism 410, a connector 420, a rotating mechanism 430, a workpiece holder 440, a clamp ring 450, and a plating bath 460. In some embodiments, the tilting mechanism 410 includes a robotic arm, a gear, a controller, or a combination thereof. In some embodiments, the tilting mechanism 410 is configured to tilt a semiconductor workpiece W during the plating process 30. In some embodiments, the rotating mechanism 430 includes a motor, a shaft, a controller, or a combination thereof. In some embodiments, the rotating mechanism 430 is configured to rotate or spin the semiconductor workpiece W during the plating process 30.

As illustrated in FIG. 2, the connector 420 physically connects the tilting mechanism 410 and the rotating mechanism 430. That is, the tilting mechanism 410 is connected to the rotating mechanism 430 through the connector 420. The connector 420 may be any connecting mechanism that is able to physically connect the tilting mechanism 410 and the rotating mechanism 430. For example, the connector 420 may be a metal block, a plastic block, or the like that is able to lift the rotating mechanism 430, the workpiece holder 440, and the clamp ring 450.

In some embodiments, the workpiece holder 440 is connected to the rotating mechanism 430 and the clamp ring 450 is connected to the workpiece holder 440. For example, the rotating mechanism 430 is able to drive the movement of the workpiece holder 440 and the clamp ring 450 together. In some embodiments, the clamp ring 450 is engaged to the workpiece holder 440. For example, the clamp ring 450 is detachable from the workpiece holder 440. In some embodiments, the workpiece holder 440 includes a metal block or the like that is able to provide support for the clamp ring 450 and the semiconductor workpiece W during the plating process 30. In some embodiments, the clamp ring 450 is made of inert materials. For example, the clamp ring 450 is made of ceramics, polypropylene (PP), polyvinyl chloride (PVC), polyvinylidene difluoride (PVDF), fiber reinforced plastics, stainless steel, polytetrafluoroethene (PTFE), or the like. The detailed configuration of the clamp ring 450 will be described below.

The plating bath 460 is located underneath the workpiece holder 440 and the clamp ring 450. In some embodiments, the plating bath 460 is filled with a plating solution PS. In some embodiments, the plating solution PS is referred to as electrolyte. As illustrated in FIG. 2, the semiconductor workpiece W is fixed onto the workpiece holder 440 through the clamp ring 450. In some embodiments, the semiconductor workpiece W is the semiconductor structure 10 in FIG. 1B. That is, the semiconductor workpiece W may be a semiconductor wafer. As such, in some embodiments, the workpiece holder 440 is referred to as a wafer holder. In some embodiments, the semiconductor workpiece W is placed in a face down manner. That is, a surface of the semiconductor workpiece W that is to be plated faces the plating bath 460 and the plating solution PS. For example, as illustrated in FIG. 2, the seed material layer 121 faces the plating bath 460 and the plating solution PS. The plating method 30 will be described below in conjunction with FIG. 2 and FIG. 3.

Figure 3:
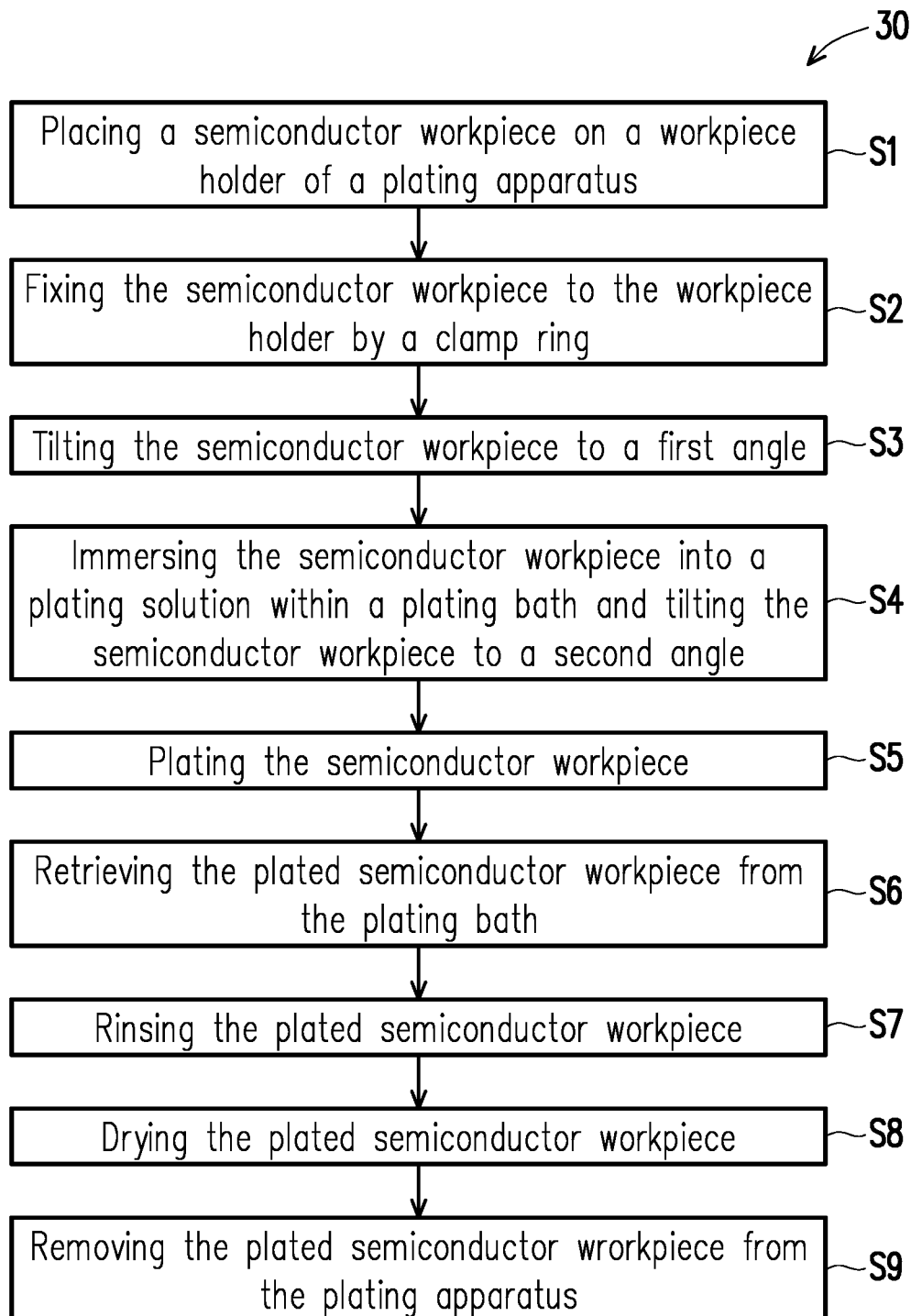
FIG. 3 is a flowchart illustrating a plating process of a semiconductor workpiece in accordance with some embodiments of the disclosure.

FIG. 3 is a flowchart illustrating a plating process 30 of a semiconductor workpiece W in accordance with some embodiments of the disclosure. Referring to FIG. 2 and FIG. 3, in step S1, the semiconductor workpiece W is placed on the workpiece holder 440 of the plating apparatus 40. Thereafter, in step S2, the semiconductor workpiece W is fixed to the workpiece holder 440 by the clamp ring 450. In some embodiments, a portion of the clamp ring 450 is pressed against a portion of the semiconductor workpiece W such that the semiconductor workpiece W is securely fixed onto the workpiece holder 440.

In step S3, the semiconductor workpiece W is tilted to a first angle. In some embodiments, the tilting of the semiconductor workpiece W may be achieved by the tilting mechanism 410. For example, since the clamp ring 450, the workpiece holder 440, the rotating mechanism 430, and the connector 420 are connected to the tilting mechanism 410, the tilting mechanism 410 may drive the clamp ring 450, the workpiece holder 440, the rotating mechanism 430 and the connector 420 to tilt to the first angle, thereby allowing the semiconductor workpiece W that is clamped to the workpiece holder 440 to tilt to the first angle. In some embodiments, the first angle is about 3° with respect to a fluid level of the plating solution PS. In some embodiments, after the semiconductor workpiece W is tilted, the rotating mechanism 430 is utilized to rotate/spin the semiconductor workpiece W. In some embodiments, a spinning speed of the semiconductor workpiece W ranges from about 10 rpm (revolutions per minute) to about 120 rpm in step S3.

Subsequently, in step S4, the semiconductor workpiece W is immersed into the plating solution PS within the plating bath 460. For example, the tilting mechanism 410 lowers the connector 420, the rotating mechanism 430, the workpiece holder 440, the clamp ring 450, and the semiconductor workpiece W such that the semiconductor workpiece W, the workpiece holder 440, and the clamp ring 450 are immersed into the plating solution PS. In some embodiments, the semiconductor workpiece W enters the plating solution PS in a tilting manner. That is, the semiconductor workpiece W is kept to be tilted with the first angle while entering the plating solution PS. In some embodiments, when clamping the semiconductor workpiece W onto the workpiece holder 440 in step S2, air bubbles may generate on a surface of the semiconductor workpiece W due to the clamping pressure. However, by using angled immersion in step S4, air bubbles on the surface of the semiconductor workpiece W are pushed by the wave advancing from the leading immersion edge toward the trailing immersion edge. As such, the tilted semiconductor workpiece W allows some of the air bubbles to discharge to the atmosphere. After the semiconductor workpiece W is immersed into the plating solution PS, the semiconductor workpiece W is tilted to a second angle. In some embodiments, the second angle is about 0° with respect to the fluid level of the plating solution PS. For example, after the semiconductor workpiece W is immersed into the plating solution PS, the semiconductor workpiece W is tilted back to extend horizontally.

In step S5, the semiconductor workpiece W is plated. In some embodiments, the semiconductor workpiece W is plated by electrodeposition of a conductive material onto the semiconductor workpiece W. The electrodeposition occurs by positioning an anode and the semiconductor workpiece W (the cathode) in the plating solution PS and applying a current such that metal ions in the plating solution PS is plated onto the semiconductor workpiece W. In step S5, the rotating mechanism 430 is utilized to rotate/spin the semiconductor workpiece W. In some embodiments, a spinning speed of the semiconductor workpiece W ranges from about 30 rpm to about 200 rpm in step S5.

After the electrodeposition of the conductive material onto the semiconductor workpiece W is completed, the plated semiconductor workpiece W is retrieved from the plating bath 460 in step S6. For example, the tilting mechanism 410 pulls the semiconductor workpiece W out of the plating solution PS. Thereafter, the rotating mechanism 430 spins the semiconductor workpiece W to spin dry the semiconductor workpiece W. That is, the plating solution PS left on the semiconductor workpiece W is removed from the semiconductor workpiece W through spinning the semiconductor workpiece W. In some embodiments, a spinning speed of the semiconductor workpiece W ranges from about 250 rpm to about 350 rpm in step S6. In some embodiments, the process in step S6 is referred to as reclaim spin.

In step S7, the plated semiconductor workpiece W is rinsed. In some embodiments, the plated semiconductor workpiece W is rinsed by jetting the plated surface of the semiconductor workpiece W with distill water, so as to remove the plating solution PS left on the plated surface of the semiconductor workpiece W. In some embodiments, during step S7, the rotating mechanism 430 also spins the semiconductor workpiece W. In some embodiments, a spinning speed of the semiconductor workpiece W ranges from about 450 rpm to about 550 rpm in step S7. Thereafter, in step S8, the plated semiconductor workpiece W is dried. In some embodiments, the plated semiconductor workpiece W is dried through spin dry. In some embodiments, a spinning speed of the semiconductor workpiece W ranges from about 700 rpm to about 800 rpm in step S8. In step S9, after the plated semiconductor workpiece W is dried, the plated semiconductor workpiece W is removed from the plating apparatus 40, so as to complete the plating process 30.

As mentioned above, by immersing the semiconductor workpiece W into the plating solution PS in a tilting manner, some of the air bubbles generated may be discharged. However, depending on the number of air bubbles generated, the angled immersion in step S4 may not be sufficient to remove all of the air bubbles. Moreover, during the immersion of the semiconductor workpiece W into the plating solution PS, additional air bubbles may be generated on the surface of the semiconductor workpiece W. The air bubbles on the surface of the semiconductor workpiece W would create blocking spots and inhibits the conductive material from forming on these blocking spots. Therefore, it is crucial to remove the air bubbles on the surface of the semiconductor workpiece W before the conductive material is plated onto the semiconductor workpiece W. In some embodiments, by forming channels in the clamp ring 450, the air bubbles may be sufficiently removed through these channels by spinning the semiconductor workpiece W before the semiconductor workpiece W is plated. Various configurations of the clamp ring 450 having channels will be described below.

Figure 4A:
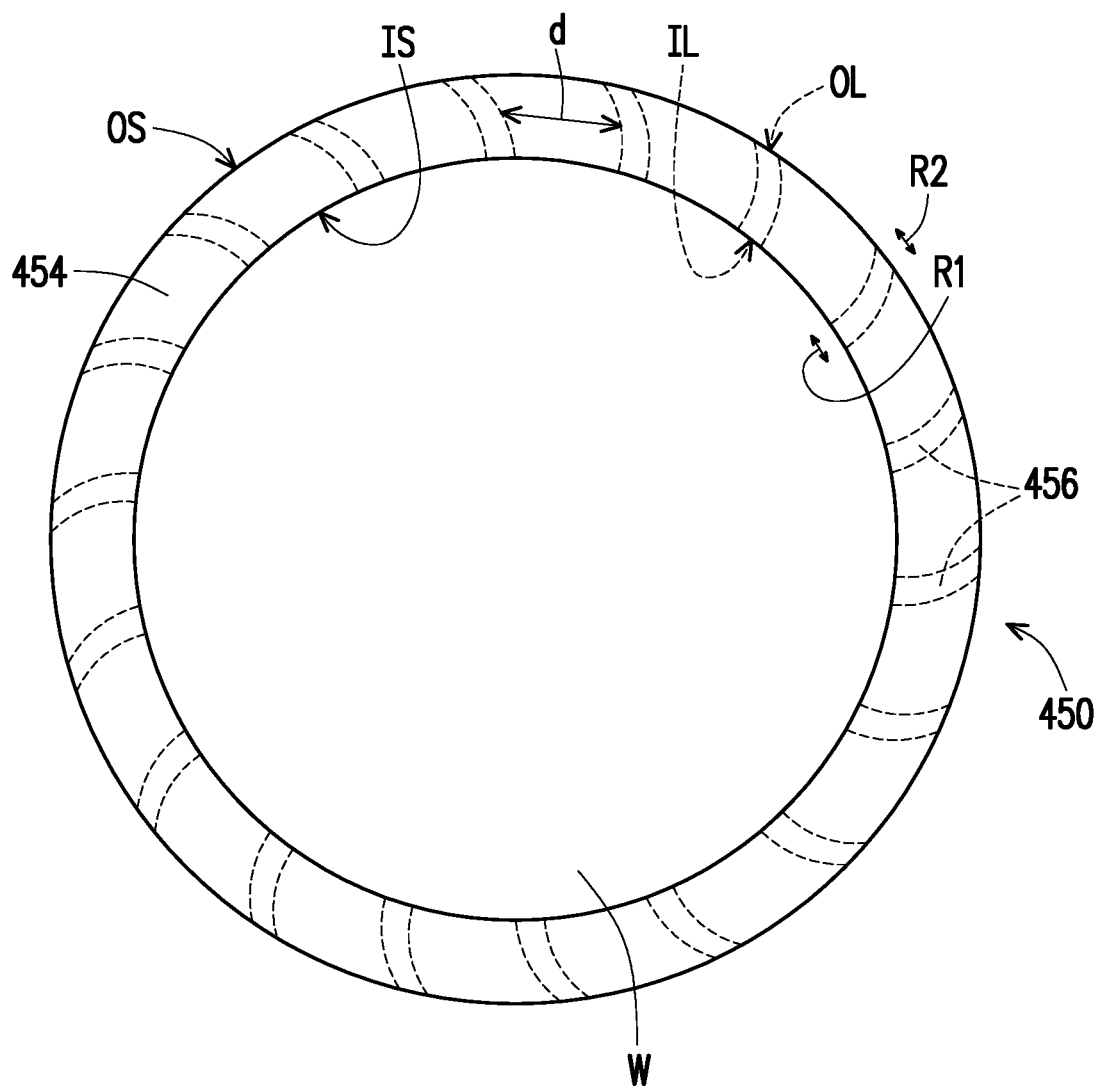
FIG. 4A is a schematic bottom view of the semiconductor workpiece and the clamp ring in FIG. 2.
Figure 4B:
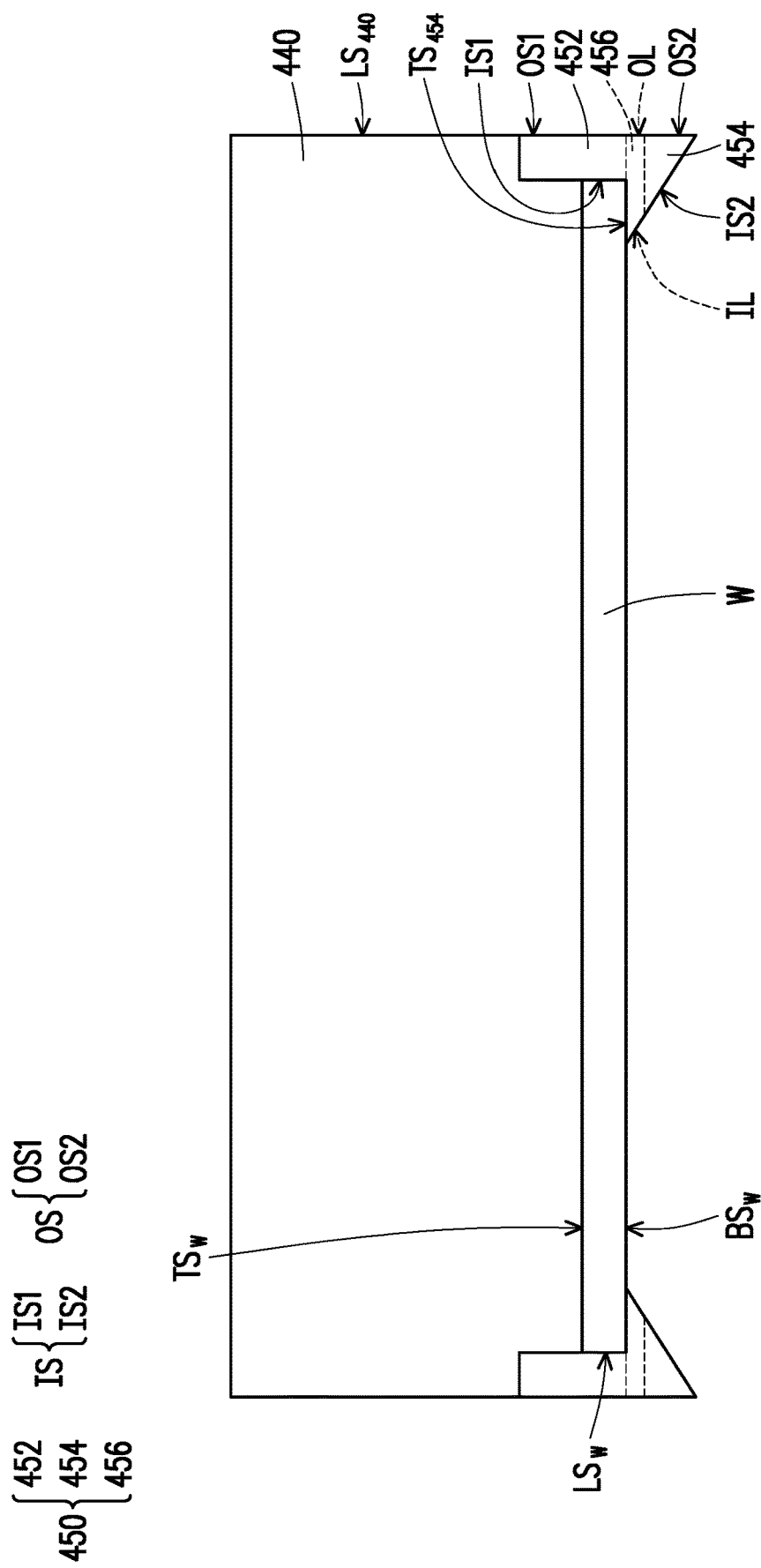
FIG. 4B is a schematic cross-sectional view of the workpiece holder, the semiconductor workpiece, and the clamp ring in FIG. 2.
Figure 4C:
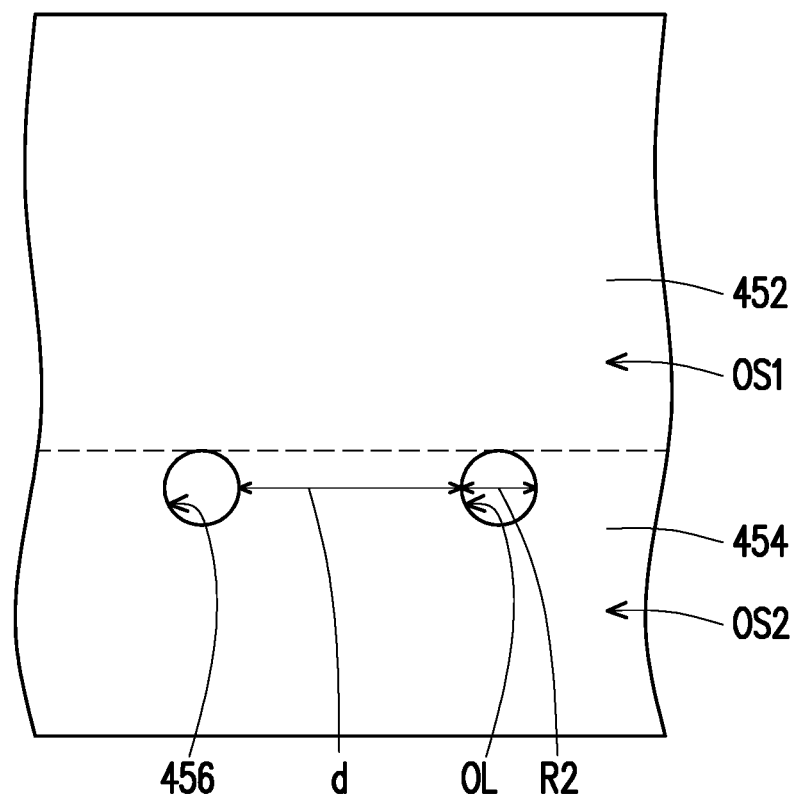
FIG. 4C is a partial side view of the clamp ring in FIG. 2.

FIG. 4A is a schematic bottom view of the semiconductor workpiece W and the clamp ring 450 in FIG. 2. FIG. 4B is a schematic cross-sectional view of the workpiece holder 440, the semiconductor workpiece W, and the clamp ring 450 in FIG. 2. FIG. 4C is a partial side view of the clamp ring 450 in FIG. 2. Referring to FIG. 4A to FIG. 4C, the clamp ring 450 is connected to the workpiece holder 440. On the other hand, the semiconductor workpiece W is placed over the workpiece holder 440 and is clamped to the workpiece holder 440 by the clamp ring 450. In some embodiments, the clamp ring 450 is engaged to the workpiece holder 440 and is detachable from the workpiece holder 440.

As illustrated in FIG. 4A and FIG. 4B, the clamp ring 450 includes a body portion 452, a protruding portion 454, and channels 456. In some embodiments, the body portion 452 is engaged/connected to the workpiece holder 440. In some embodiments, the body portion 452 has an inner surface IS1 and an outer surface OS1 opposite to the inner surface IS1. In some embodiments, the inner surface IS1 of the body portion 452 is parallel to the outer surface OS1 of the body portion 452. As illustrated in FIG. 4B, the outer surface OS1 of the body portion 452 is aligned with a lateral surface $LS_{440}$ of the workpiece holder 440. On the other hand, the inner surface IS1 of the body portion 452 is coplanar with a lateral surface $LS_W$ of the semiconductor workpiece W. That is, the body portion 452 covers the lateral surface $LS_W$ of the semiconductor workpiece W. In some embodiments, a bottom surface $BS_{452}$ of the body portion 452 is substantially coplanar with a bottom surface $BS_W$ of the semiconductor workpiece W. In some embodiments, the body portion 452 has a rectangular cross-sectional view, as shown in FIG. 4B.

In some embodiments, the protruding portion 454 of the clamp ring 450 is connected to the body portion 452 of the clamp ring 450. For example, the protruding portion 454 protrudes from the bottom surface $BS_{452}$ of the body portion 452. In some embodiments, the protruding portion 454 and the body portion 452 of the clamp ring 450 are integrally formed. For example, the protruding portion 454 and the body portion 452 are made of a same material. In some embodiments, the protruding portion 454 has an inner surface IS2 and an outer surface OS2. In some embodiments, the inner surface IS2 of the protruding portion 454 is not parallel to the outer surface OS2 of the protruding portion 454. In some embodiments, the inner surface IS2 of the protruding portion 454 is an inclined surface. That is, the protruding portion 454 has an inclined inner surface IS2. In some embodiments, the inclined inner surface IS2 of the protruding portion 454 is connected to the outer surface OS2 of the protruding portion 454. In some embodiments, the protruding portion 454 further has a top surface $TS_{454}$ which connects the outer surface OS2 and the inclined inner surface IS2. In some embodiments, the protruding portion 454 has a triangular cross-sectional view, as shown in FIG. 4B. In some embodiments, the top surface $TS_{454}$ of the protruding portion 454 is coplanar with the bottom surface $BS_{452}$ of the body portion 452 and the bottom surface $BS_W$ of the semiconductor workpiece W. That is, a portion of the protruding portion 454 extends horizontally to cover a portion of the bottom surface $BS_W$ of the semiconductor workpiece W. In some embodiments, the outer surface OS2 of the protruding portion 454 is aligned with the outer surface OS1 of the body portion 452. In some embodiments, the protruding portion 454 is a continuous pattern. For example, as illustrated in the bottom view of FIG. 4A, the protruding portion 454 is a continuous ring.

In some embodiments, the inner surface IS1 of the body portion 452 and the inner surface IS2 of the protruding portion 454 are collectively referred to as an inner surface IS of the clamp ring 450. Similarly, the outer surface OS1 of the body portion 452 and the outer surface OS2 of the protruding portion 454 are collectively referred to as an outer surface OS of the clamp ring 450. As illustrated in FIG. 4A and FIG. 4B, the channels 456 penetrate through the clamp ring 450 to communicate the inner surface IS and the outer surface OS of the clamp ring 450. Since the channels 456 communicate the inner surface IS and the outer surface OS of the clamp ring 450, the channels 456 may serve as discharging mechanisms for the air bubbles trapped on the bottom surface $BS_W$ of the semiconductor workpiece W during the plating process 30. For example, the air bubbles are removed through the channels 456 of the clamp ring 450 by spinning the semiconductor workpiece W before the semiconductor workpiece W is plated (i.e. between step S4 and step S5 in FIG. 3). In some embodiments, the undesired air bubbles on the bottom surface $BS_W$ of the semiconductor workpiece W can be expelled through the channels 456 of the clamp ring 450 by the forced centrifugal direction flow, which is generated by the pressure difference between the inner surface IS and the outer surface OS of the clamp ring 450 when the semiconductor workpiece W is spinning in the plating bath 460 according to Bernoulli's principle. For example, since the velocity at the inner surface IS is smaller than the velocity at the outer surface OS, the pressure at the inner surface IS is larger than the pressure at the outer surface OS. The larger pressure at the inner surface IS would push the air bubbles to the outer surface with lower pressure, and the channels 456 provide paths for the air bubbles to travel from the inner surface IS to the outer surface OS of the clamp ring 450. As such, the undesired air bubbles may be expelled from the semiconductor workpiece W, and the plating quality may be sufficiently enhanced. In some embodiments, since the channels 456 provide the paths for air to travel, the channels 456 are referred to as vents.

In some embodiments, the channels 456 penetrate through the protruding portion 454 of the clamp ring 450 to communicate the inner surface IS2 and the outer surface OS2 of the protruding portion 454. As illustrated in FIG. 4B, since the channels 456 are located within the protruding portion 454 of the clamp ring 450, the channels 456 (i.e. the vents) are also located below the bottom surface $BS_W$ of the semiconductor workpiece W. As illustrated in FIG. 4A and FIG. 4B, each channel 456 has a first end located at the inner surface IS of the clamp ring 450 and a second end located at the outer surface OS of the clamp ring 450. In some embodiments, the first end is referred to as an inlet IL and the second end is referred as an outlet OL. For example, each vent has an inlet IL and an outlet OL. In some embodiments, the inlets IL of the channels 456 (i.e. the vents) are located on the inclined inner surface IS2 of the protruding portion 454 while the outlets OL of the channels 456 (i.e. the vents) are located on the outer surface OS2 of the protruding portion 454. Moreover, the inlets IL are closer to the semiconductor workpiece W than the outlets OL.

As illustrated in FIG. 4A to FIG. 4C, the channels 456 are circular channels. That is, the inlets IL and the outlets OL of the channel 456 are circular openings. However, the disclosure is not limited thereto. In some alternative embodiments, the channels 456 may be rectangular channels, triangular channels, or may have other geometries. In some embodiments, a size of the first end (i.e. the inlet IL) of the channel 456 is substantially equal to a size of the second end (i.e. the outlet OL) of the channel 456. For example, a radius R1 of the inlet IL of the channel 456 is substantially equal to a radius R2 of the outlet OL of the channel 456. In some embodiments, the radius R1 and the radius R2 range from about 3 µm to about 10 µm. In some embodiments, a distance d between two adjacent channels 456 ranges from about 5 µm to about 10 µm. As illustrated in FIG. 4A, each channel 456 is curved along a counterclockwise direction from the bottom view. In some embodiments, when the semiconductor workpiece W is spun along the counterclockwise direction, the arrangement of the channels 456 may further aid the air bubbles to travel from the inner surface IS to the outer surface OS of the clamp ring 450 rapidly.

Figure 5A:
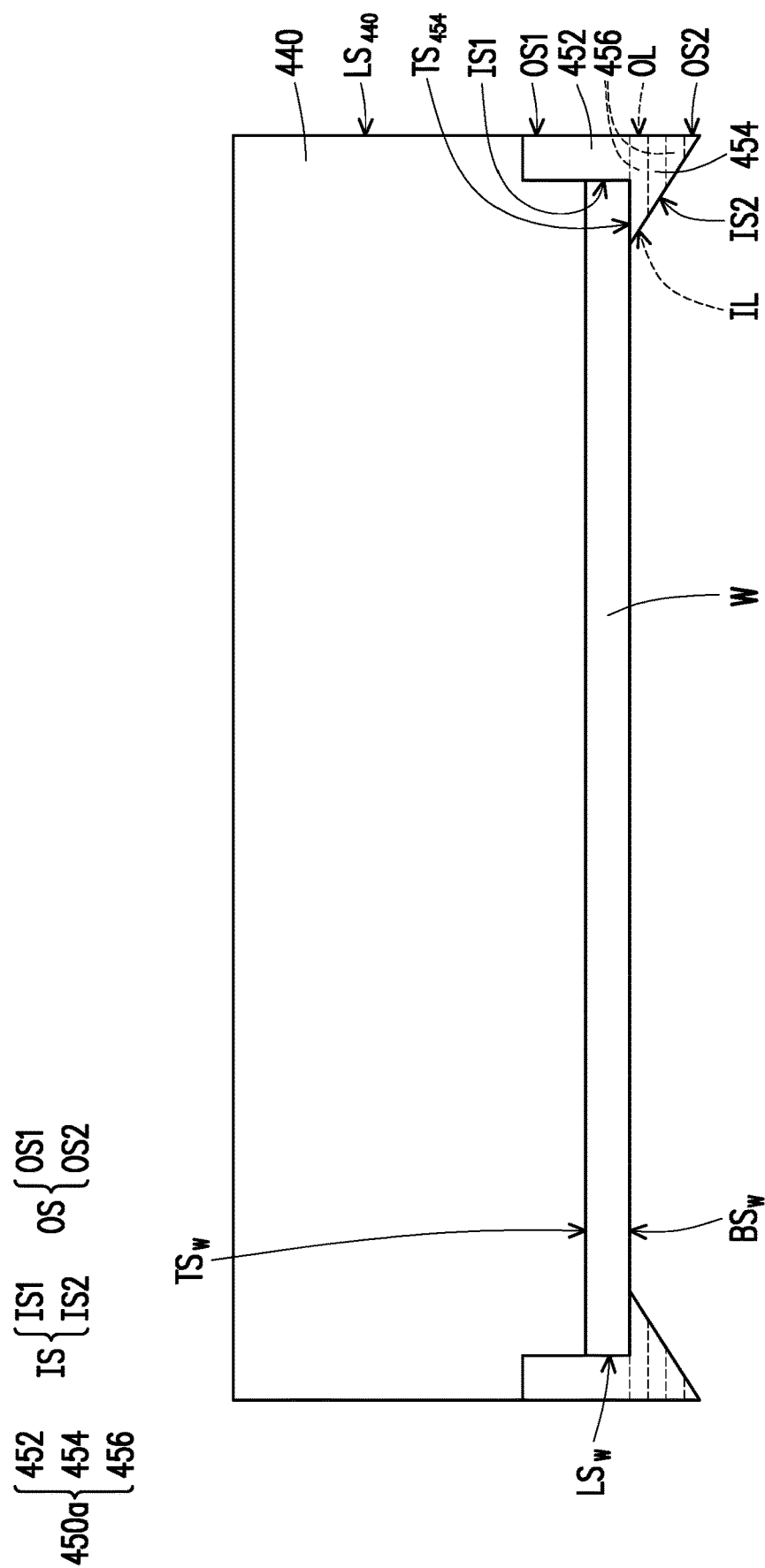
FIG. 5A is a schematic cross-sectional view of a workpiece holder, a semiconductor workpiece, and a clamp ring in accordance with some alternative embodiments of the disclosure.
Figure 5B:
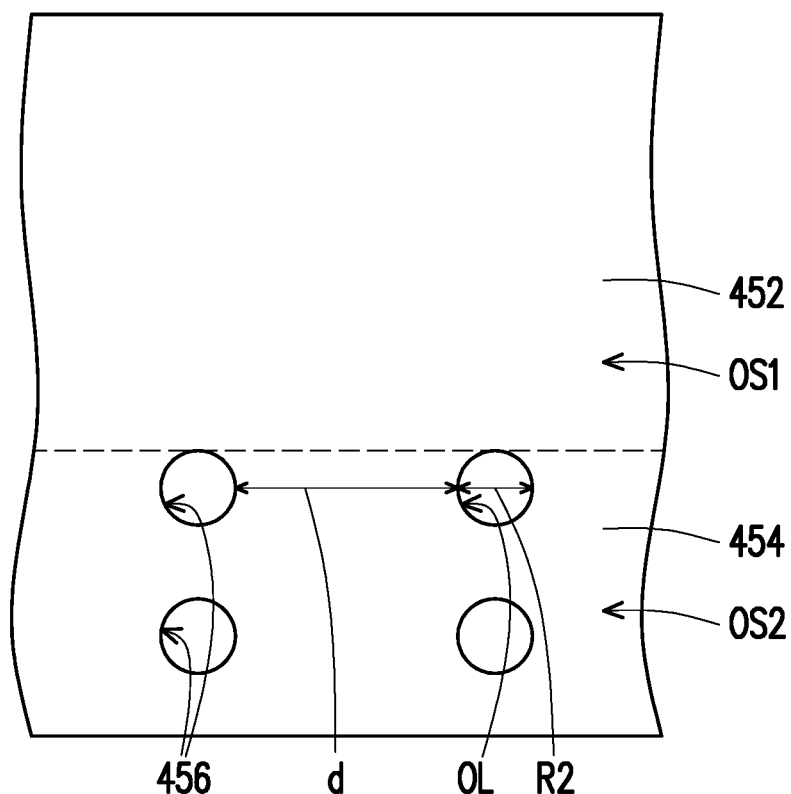
FIG. 5B is a partial side view of the clamp ring in accordance with some alternative embodiments of the disclosure.

FIG. 5A is a schematic cross-sectional view of a workpiece holder 440, a semiconductor workpiece W, and a clamp ring 450a in accordance with some alternative embodiments of the disclosure. FIG. 5B is a partial side view of the clamp ring 450a in accordance with some alternative embodiments of the disclosure. Referring to FIG. 5A and FIG. 5B, the workpiece holder 440, the semiconductor workpiece W, and the clamp ring 450a in FIG. 5A and FIG. 5B are respectively similar to the workpiece holder 440, the semiconductor workpiece W, and the clamp ring 450 in FIG. 4A to FIG. 4C, so similar elements are denoted by the same reference numeral and the detailed descriptions thereof are omitted herein. However, in the clamp ring 450a of FIG. 5A and FIG. 5B, multiple rows of channels 456 are provided in the protruding portion 454. For example, as illustrated in FIG. 5B, multiple channels 456 are aligned along a vertical (i.e. z-axis) direction. That is, each channel 456 is aligned with a corresponding channel 456 in the adjacent row. In some embodiments, each channel 456 is parallel with another channel 456 that is located directly above or directly underneath it.

Figure 6:
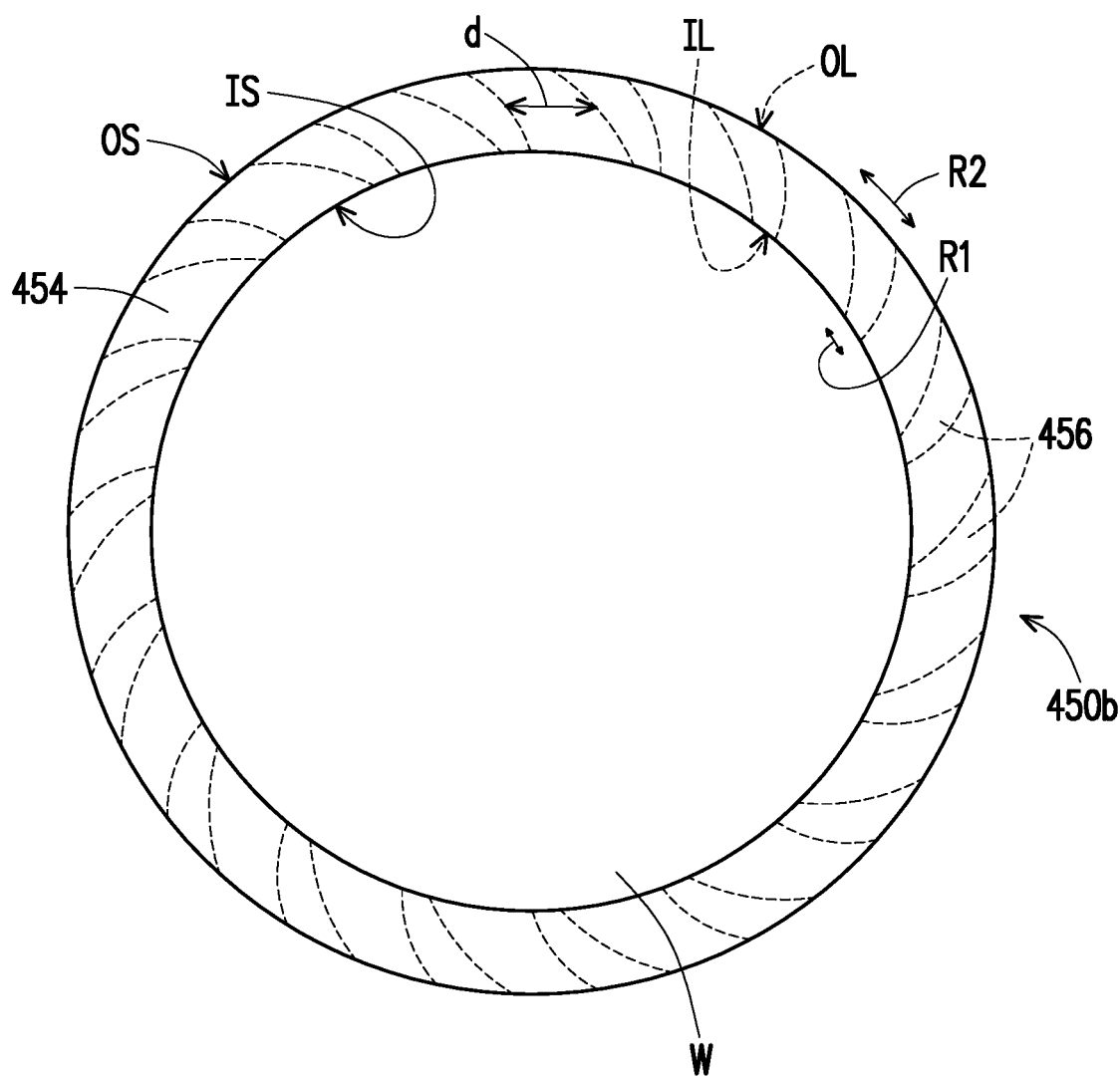
FIG. 6 is a schematic bottom view of a semiconductor workpiece and a clamp ring in accordance with some alternative embodiments of the disclosure.

FIG. 6 is a schematic bottom view of a semiconductor workpiece W and a clamp ring 450b in accordance with some alternative embodiments of the disclosure. Referring to FIG. 6, the semiconductor workpiece W and the clamp ring 450b in FIG. 6 are respectively similar to the semiconductor workpiece W and the clamp ring 450 in FIG. 4A to FIG. 4C, so similar elements are denoted by the same reference numeral and the detailed descriptions thereof are omitted herein. However, in the clamp ring 450b of FIG. 6, a size of the first end (i.e. the inlet IL) of the channel 456 is different from a size of the second end (i.e. the outlet OL) of the channel 456. In some embodiments, a radius R1 of the inlet IL of the channel 456 is smaller than a radius R2 of the outlet OL of the channel 456. For example, the size of each channel 456 gradually increases from the inner surface IS of the clamp ring 450b toward the outer surface OS of the clamp ring 450b. In some embodiments, each channel 456 is a horn shape. In some embodiments, the radius R1 ranges from about 3 µm to about 7 µm and the radius R2 ranges from about 8 µm to about 15 µm.

Figure 7:
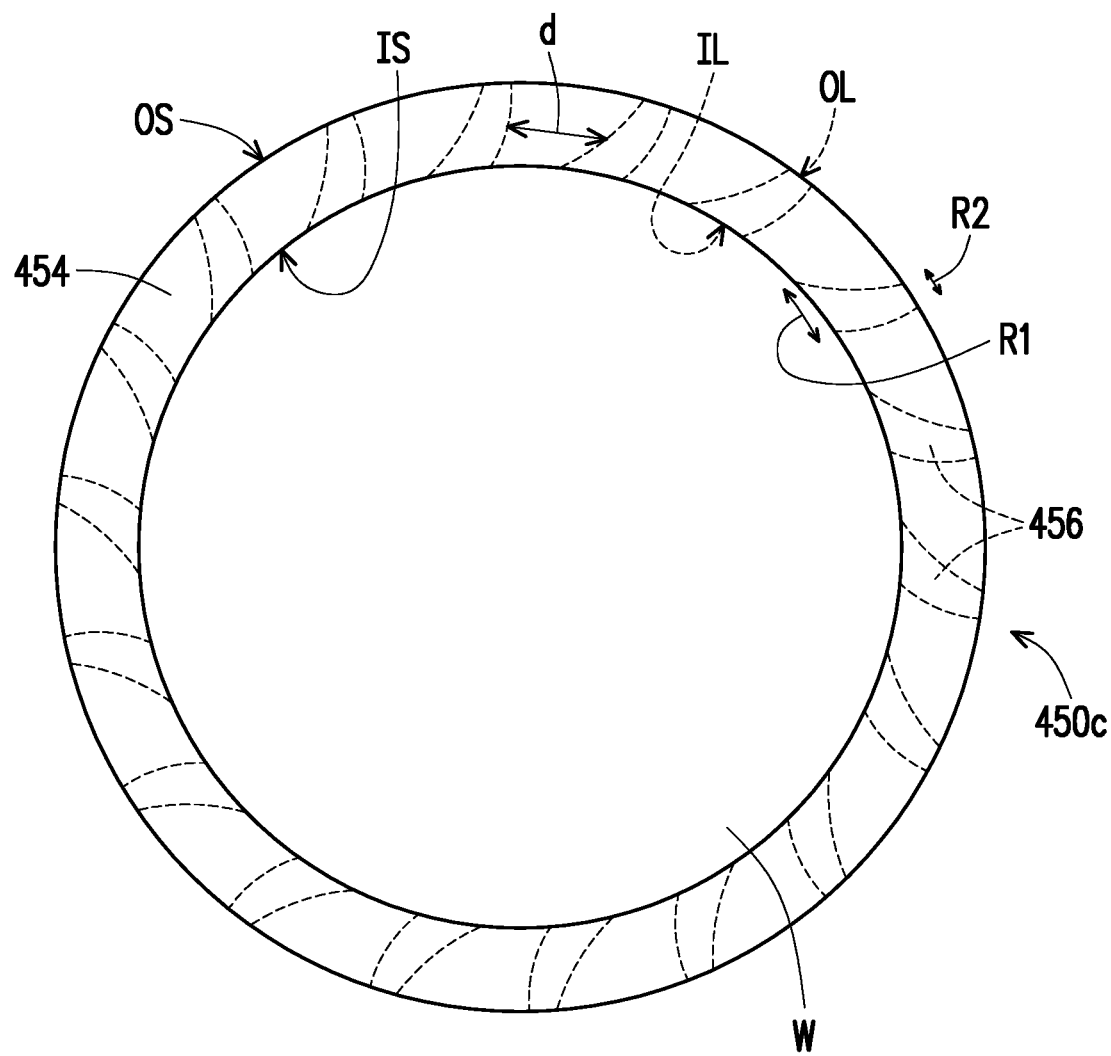
FIG. 7 is a schematic bottom view of a semiconductor workpiece and a clamp ring in accordance with some alternative embodiments of the disclosure.

FIG. 7 is a schematic bottom view of a semiconductor workpiece W and a clamp ring 750c in accordance with some alternative embodiments of the disclosure. Referring to FIG. 7, the semiconductor workpiece W and the clamp ring 450c in FIG. 7 are respectively similar to the semiconductor workpiece W and the clamp ring 450 in FIG. 4A to FIG. 4C, so similar elements are denoted by the same reference numeral and the detailed descriptions thereof are omitted herein. However, in the clamp ring 450c of FIG. 7, a size of the first end (i.e. the inlet IL) of the channel 456 is different from a size of the second end (i.e. the outlet OL) of the channel 456. In some embodiments, a radius R1 of the inlet IL of the channel 456 is larger than a radius R2 of the outlet OL of the channel 456. For example, the size of each channel 456 gradually decreases from the inner surface IS of the clamp ring 450c toward the outer surface OS of the clamp ring 450c. In some embodiments, each channel 456 is a horn shape. In some embodiments, the radius R1 ranges from about 8 µm to about 15 µm and the radius R2 ranges from about 3 µm to about 7 µm.

Figure 8:
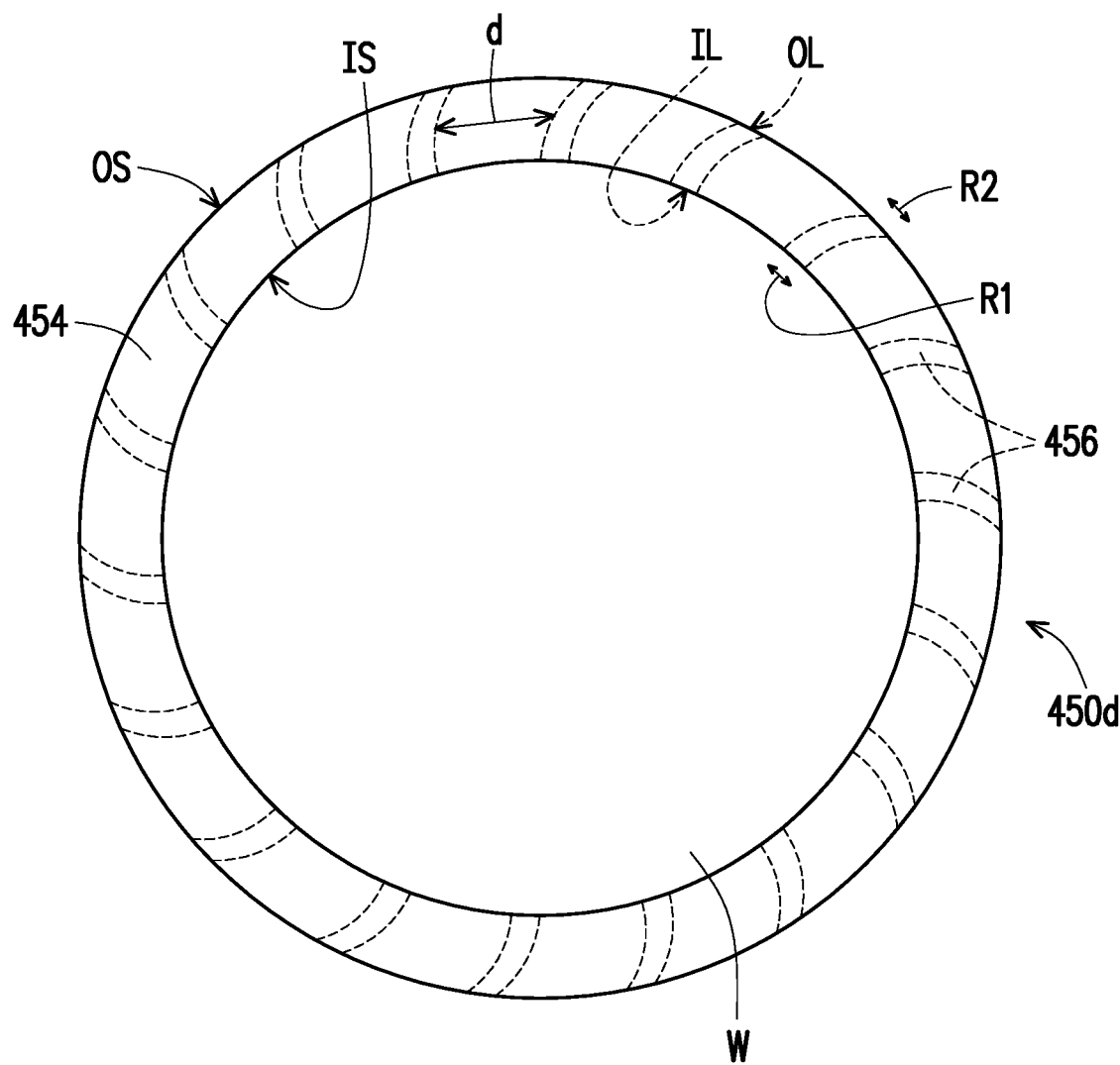
FIG. 8 is a schematic bottom view of a semiconductor workpiece and a clamp ring in accordance with some alternative embodiments of the disclosure.

FIG. 8 is a schematic bottom view of a semiconductor workpiece W and a clamp ring 450d in accordance with some alternative embodiments of the disclosure. Referring to FIG. 8, the semiconductor workpiece W and the clamp ring 450d in FIG. 8 are respectively similar to the semiconductor workpiece W and the clamp ring 450 in FIG. 4A to FIG. 4C, so similar elements are denoted by the same reference numeral and the detailed descriptions thereof are omitted herein. However, in the clamp ring 450d of FIG. 8, each channel 456 is curved along a clockwise direction from the bottom view. In some embodiments, when the semiconductor workpiece W is spun along the clockwise direction, the arrangement of the channels 456 may further aid the air bubbles to travel from the inner surface IS to the outer surface OS of the clamp ring 450d rapidly.

Figure 9A:
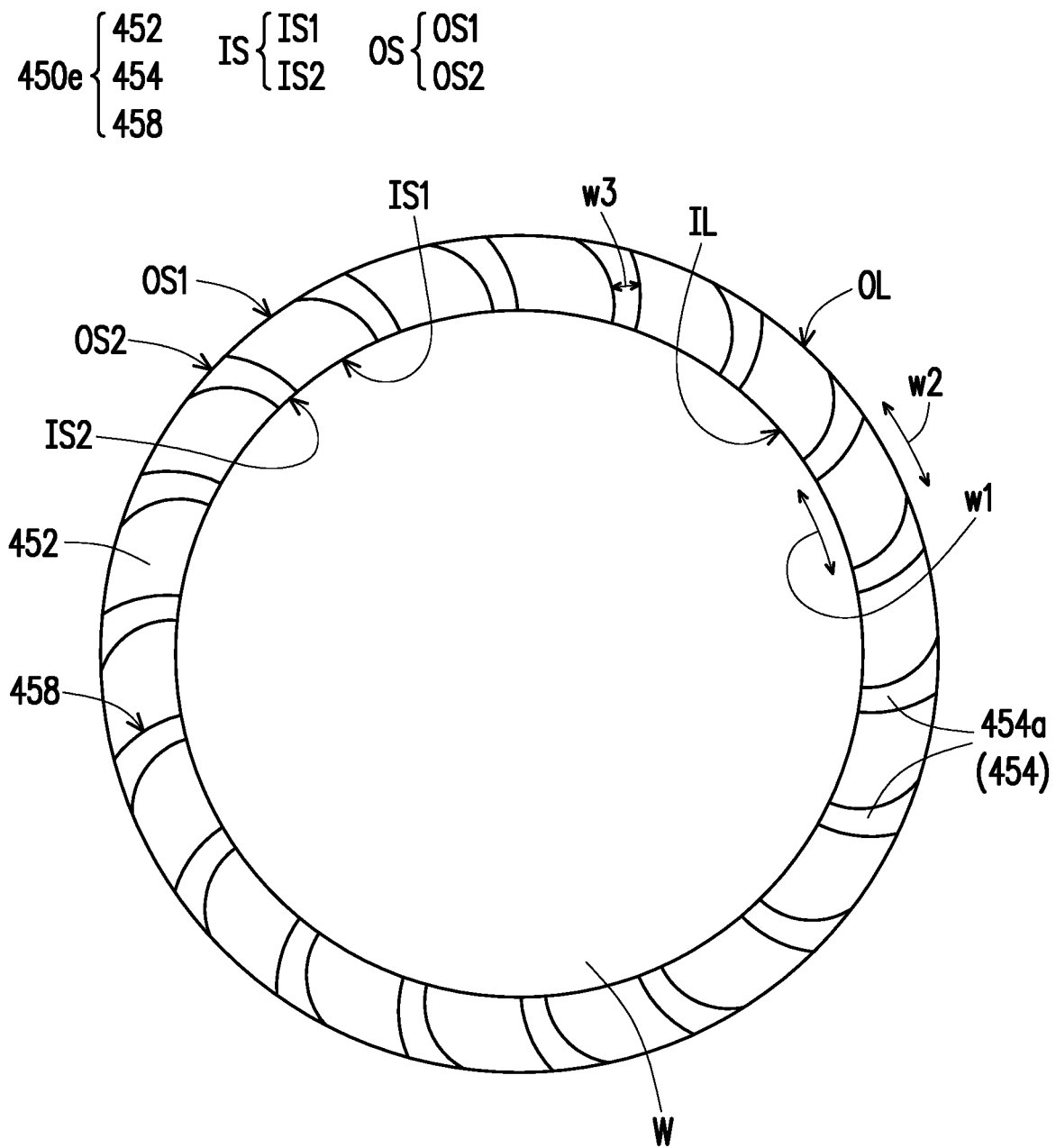
FIG. 9A is a schematic bottom view of a semiconductor workpiece and a clamp ring in accordance with some alternative embodiments of the disclosure.
Figure 9B:
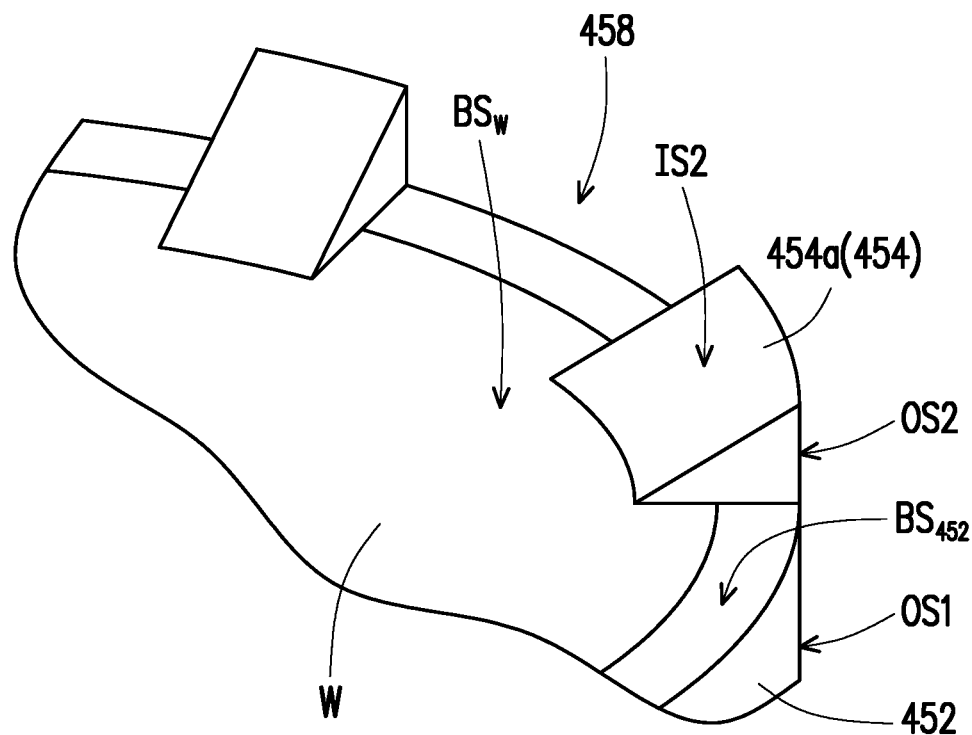
FIG. 9B is a partial perspective view of the semiconductor workpiece and the clamp ring in accordance with some alternative embodiments of the disclosure.
Figure 9C:
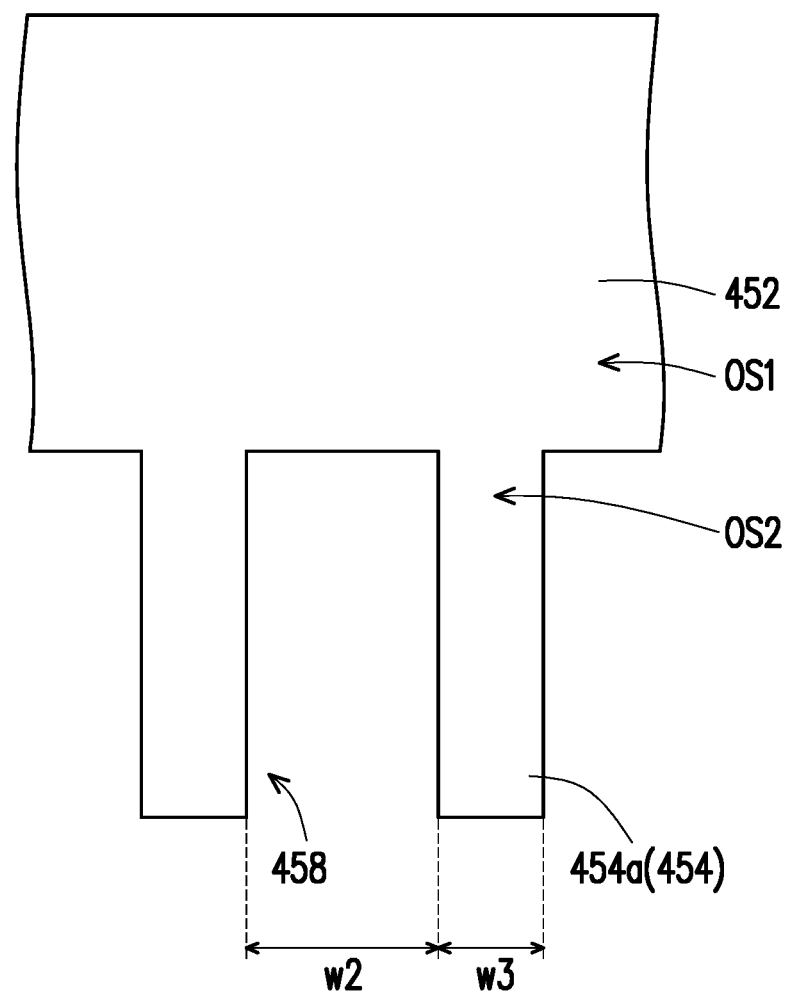
FIG. 9C is a partial side view of the clamp ring in accordance with some alternative embodiments of the disclosure.

FIG. 9A is a schematic bottom view of a semiconductor workpiece W and a clamp ring 450e in accordance with some alternative embodiments of the disclosure. FIG. 9B is a partial perspective view of the semiconductor workpiece W and the clamp ring 450e in accordance with some alternative embodiments of the disclosure. FIG. 9C is a partial side view of the clamp ring 450e in accordance with some alternative embodiments of the disclosure. For simplicity in visualization, orientations of the semiconductor workpiece W and the clamp ring 450e in FIG. 9B are flipped as compared to FIG. 9A and FIG. 9C. Referring to FIG. 9A to FIG. 9C, the semiconductor workpiece W and the clamp ring 450e in FIG. 9A to FIG. 9C are respectively similar to the semiconductor workpiece W and the clamp ring 450 in FIG. 4A to FIG. 4C, so similar elements are denoted by the same reference numeral and the detailed descriptions thereof are omitted herein. However, the channels 456 in the clamp ring 450 of FIG. 4A to FIG. 4C are omitted in the clamp ring 450e of FIG. 9A to FIG. 9C. In some embodiments, the clamp ring 450e includes a body portion 454, a protruding portion 545, and channels 458. The body portion 452 of the clamp ring 450e in FIG. 9A to FIG. 9C is similar to the body portion 452 in FIG. 4A to FIG. 4C, so the detailed description thereof is omitted herein.

In some embodiments, the protruding portion 454 of the clamp ring 450e in FIG. 9A to FIG. 9C is similar to the protruding portion 454 of the clamp ring 450 in FIG. 4A to FIG. 4C. However, the protruding portion 454 of the clamp ring 450e is not a continuous pattern. For example, the protruding portion 454 of the clamp ring 450e includes a plurality of protruding patterns 454a disconnected from one another. That is, the protruding patterns 454a are spatially separated from one another. In some embodiments, the protruding portion 454 of the clamp ring 450e is connected to the body portion 452 of the clamp ring 450e. For example, the protruding patterns 454a of the protruding portion 454 protrude from the bottom surface $BS_{452}$ of the body portion 452. In some embodiments, the protruding patterns 454a and the body portion 452 of the clamp ring 450e are integrally formed. However, the disclosure is not limited thereto. In some alternative embodiments, the protruding patterns 454a may be installed on the body portion 452 and may be detachable from the body portion 452. A material of the protruding patterns 454a may be the same as or different from the material of the body portion 452. In some embodiments, each protruding pattern 454a has an inner surface IS2 and an outer surface OS2. In some embodiments, the inner surface IS2 of the protruding pattern 454a is not parallel to the outer surface OS2 of the protruding pattern 454a. In some embodiments, the inner surface IS2 of the protruding pattern 454a is an inclined surface. That is, the protruding pattern 454a has an inclined inner surface IS2. In some embodiments, the inclined inner surface IS2 of the protruding pattern 454a is connected to the outer surface OS2 of the protruding pattern 454a. In some embodiments, each of the protruding patterns 454a is a triangular prism, as shown in FIG. 9B. In some embodiments, a portion of each protruding pattern 454a extends horizontally to cover a portion of the bottom surface $BS_W$ of the semiconductor workpiece W. In some embodiments, the outer surface OS2 of the protruding pattern 454a is aligned with the outer surface OS1 of the body portion 452.

In some embodiments, the inner surface IS1 of the body portion 452 and the inner surfaces IS2 of the protruding patterns 454a (i.e. the protruding portion 454) are collectively referred to as an inner surface IS of the clamp ring 450e. Similarly, the outer surface OS1 of the body portion 452 and the outer surface OS2 of protruding patterns 454a (i.e. the protruding portion 454) are collectively referred to as an outer surface OS of the clamp ring 450e. As illustrated in FIG. 9A and FIG. 9B, each channel 458 is located between two adjacent protruding patterns 454a to communicate the inner surface IS and the outer surface OS of the clamp ring 450e. For example, each channel 458 is defined by a space between two adjacent protruding patterns 454a. Since the channels 458 communicate the inner surface IS and the outer surface OS of the clamp ring 450e, the channels 458 may serve as discharging mechanisms for the air bubbles trapped on the bottom surface $BS_W$ of the semiconductor workpiece W during the plating process 30. For example, the air bubbles are removed through the channels 458 of the clamp ring 450e by spinning the semiconductor workpiece W before the semiconductor workpiece W is plated. In some embodiments, the undesired air bubbles on the bottom surface $BS_W$ of the semiconductor workpiece W can be expelled through the channels 458 of the clamp ring 450e by the forced centrifugal direction flow when the semiconductor workpiece W is spinning in the plating bath 460. As such, the plating quality may be sufficiently enhanced. In some embodiments, since the channels 458 provide the paths for air to travel, the channels 458 are referred to as vents.

As illustrated in FIG. 9B and FIG. 9C, since the channels 458 are located between two adjacent protruding patterns 454a of the clamp ring 450e, the channels 458 (i.e. the vents) are also located below the bottom surface $BS_W$ of the semiconductor workpiece W. As illustrated in FIG. 9A, each channel 458 has a first end located at a same plane as the inner surface IS of the clamp ring 450e and a second end located at a same plane as the outer surface OS of the clamp ring 450e. In some embodiments, the first end is referred to as an inlet IL and the second end is referred as an outlet OL. For example, each vent has an inlet IL and an outlet OL. In some embodiments, the inlets IL of the channels 458 (i.e. the vents) are located at a same plane as the inclined inner surfaces IS2 of the protruding patterns 454a while the outlets OL of the channels 458 (i.e. the vents) are located at a same plane as the outer surfaces OS2 of the protruding patterns 454a. Moreover, the inlets IL are closer to the semiconductor workpiece W than the outlets OL.

As illustrated in FIG. 9A to FIG. 9C, the channels 458 are open channels. In some embodiments, a size of the each channel 458 is substantially equal to a distance between two adjacent protruding patterns 454a. In some embodiments, a size of the first end (i.e. the inlet IL) of the channel 458 is substantially equal to a size of the second end (i.e. the outlet OL) of the channel 458. For example, a width w1 of the inlet IL of the channel 458 is substantially equal to a width w2 of the outlet OL of the channel 458. In some embodiments, the width w1 and the width w2 range from about 5 µm to about 15 µm. In some embodiments, a width w3 of each protruding pattern 454a is not uniform. For example, the width w3 of the protruding pattern 454a gradually increases or decreases from the inner surface IS2 of the protruding pattern 454a toward the outer surface OS2 of the protruding pattern 454a. However, the disclosure is not limited thereto. In some alternative embodiments, the width w3 of each protruding pattern 454a is uniform. In some embodiments, the width w3 of each protruding pattern 454a ranges from about 5 µm to about 15 µm. As illustrated in FIG. 9A, each channel 458 is curved along a counterclockwise direction from the bottom view. In some embodiments, when the semiconductor workpiece W is spun along the counterclockwise direction, the arrangement of the channels 458 may further aid the air bubbles to travel from the inner surface IS to the outer surface OS of the clamp ring 450f rapidly.

Figure 10:
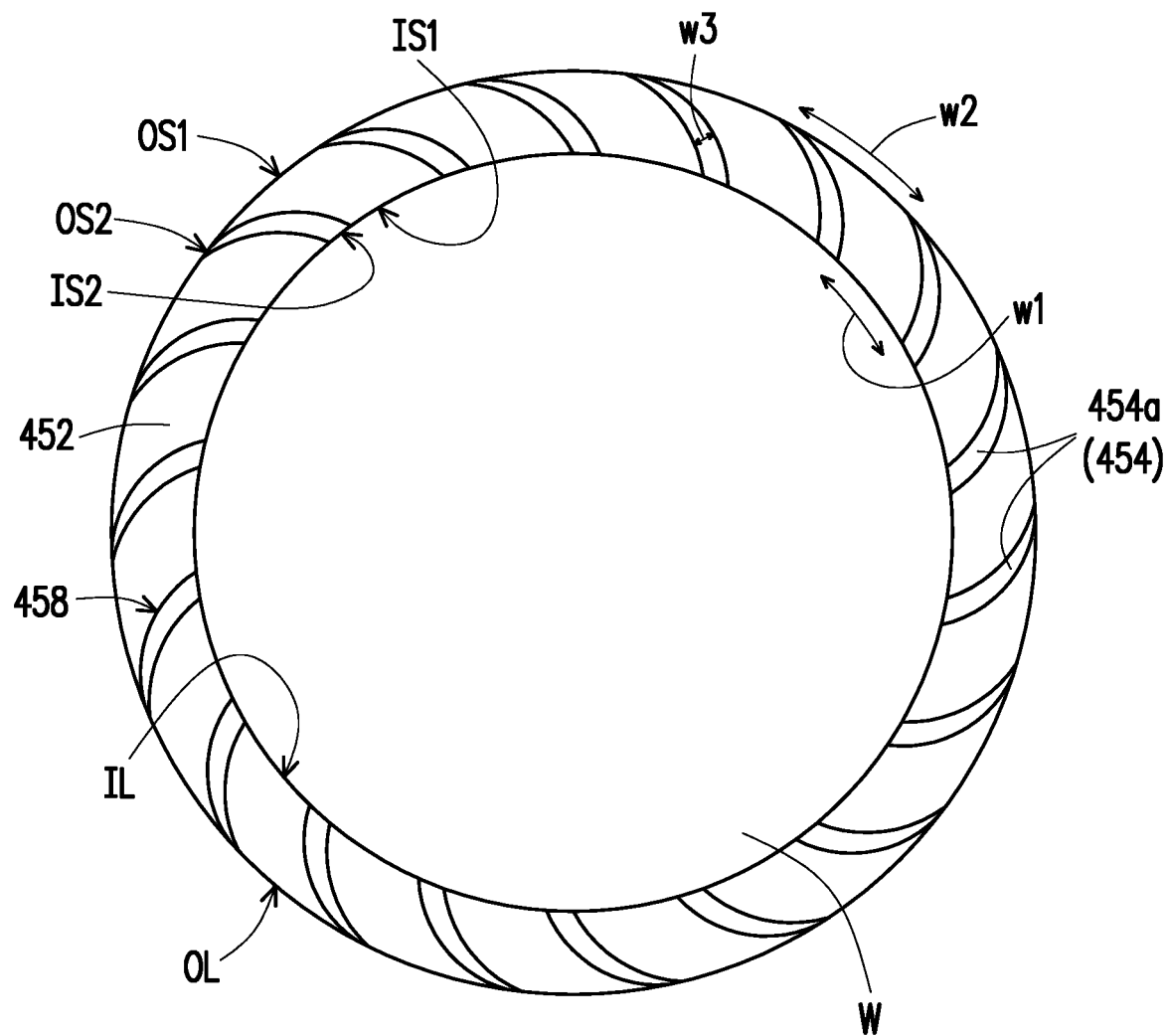
FIG. 10 is a schematic bottom view of a semiconductor workpiece and a clamp ring in accordance with some alternative embodiments of the disclosure.

FIG. 10 is a schematic bottom view of a semiconductor workpiece W and a clamp ring 450f in accordance with some alternative embodiments of the disclosure. Referring to FIG. 10, the semiconductor workpiece W and the clamp ring 450f in FIG. 10 are respectively similar to the semiconductor workpiece W and the clamp ring 450e in FIG. 9A to FIG. 9C, so similar elements are denoted by the same reference numeral and the detailed descriptions thereof are omitted herein. However, in the clamp ring 450f of FIG. 10, a size of the first end (i.e. the inlet IL) of the channel 458 is different from a size of the second end (i.e. the outlet OL) of the channel 458. In some embodiments, a width w1 of the inlet IL of the channel 458 is smaller than a width w2 of the outlet OL of the channel 458. For example, the size of each channel 458 gradually increases from the inner surface IS of the clamp ring 450f toward the outer surface OS of the clamp ring 450f. In some embodiments, each channel 458 is a horn shape. In some embodiments, the width w1 ranges from about 3 µm to about 7 µm and the width w2 ranges from about 8 µm to about 12 µm. In some embodiments, a width w3 of each protruding pattern 454a is not uniform. For example, the width w3 of the protruding pattern 454a gradually decreases from the inner surface IS2 of the protruding pattern 454a toward the outer surface OS2 of the protruding pattern 454a. However, the disclosure is not limited thereto. In some alternative embodiments, the width w3 of each protruding pattern 454a is uniform. In some embodiments, the width w3 of each protruding pattern 454a ranges from about 5 µm to about 15 µm.

Figure 11:
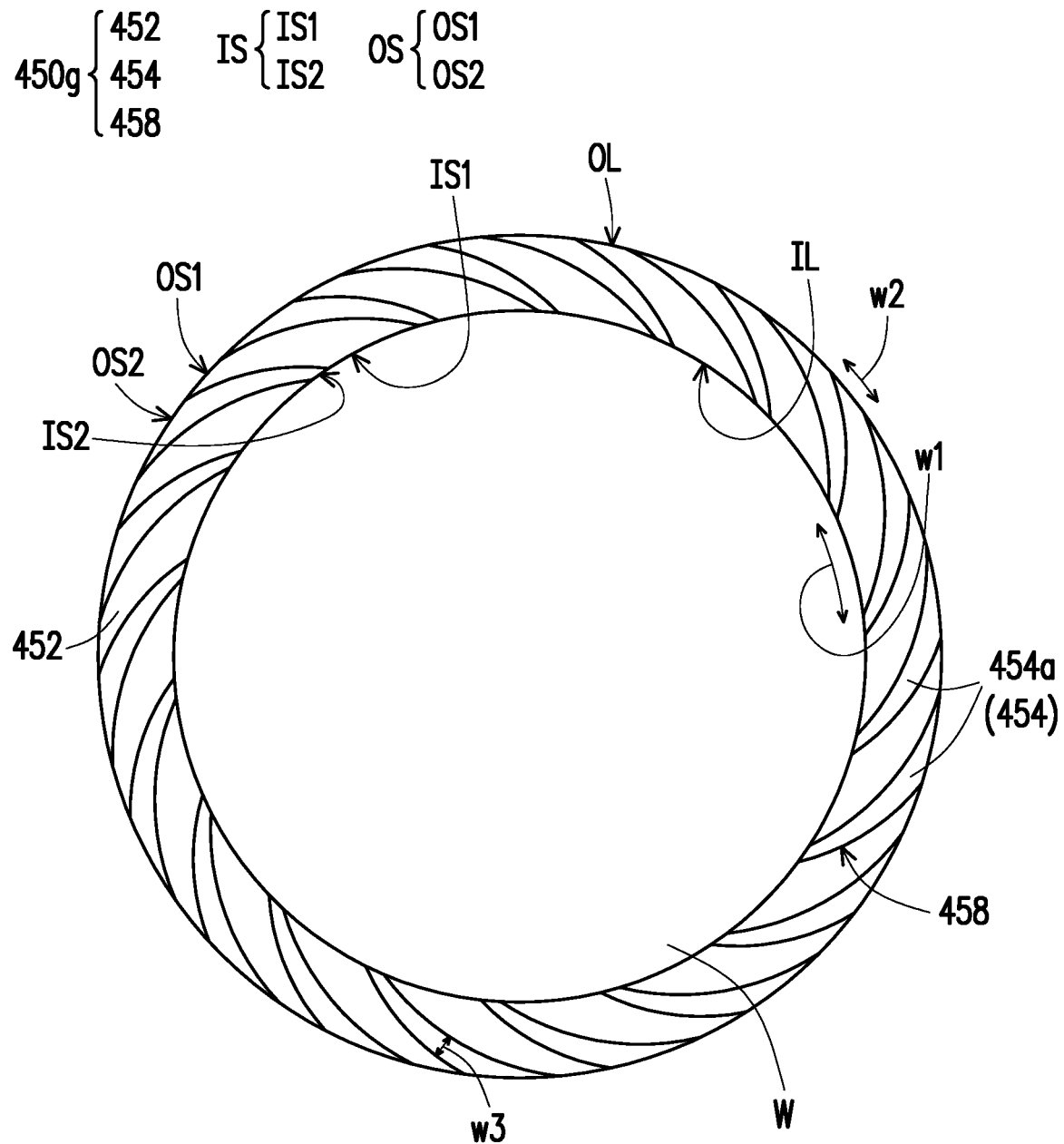
FIG. 11 is a schematic bottom view of a semiconductor workpiece and a clamp ring in accordance with some alternative embodiments of the disclosure.

FIG. 11 is a schematic bottom view of a semiconductor workpiece W and a clamp ring 450g in accordance with some alternative embodiments of the disclosure. Referring to FIG. 11, the semiconductor workpiece W and the clamp ring 450g in FIG. 11 are respectively similar to the semiconductor workpiece W and the clamp ring 450e in FIG. 9A to FIG. 9C, so similar elements are denoted by the same reference numeral and the detailed descriptions thereof are omitted herein. However, in the clamp ring 450g of FIG. 11, a size of the first end (i.e. the inlet IL) of the channel 458 is different from a size of the second end (i.e. the outlet OL) of the channel 458. In some embodiments, a width w1 of the inlet IL of the channel 458 is larger than a width w2 of the outlet OL of the channel 458. For example, the size of each channel 458 gradually decreases from the inner surface IS of the clamp ring 450g toward the outer surface OS of the clamp ring 450g. In some embodiments, each channel 458 is a horn shape. In some embodiments, the width w1 ranges from about 8 µm to about 12 µm and the width w2 ranges from about 3 µm to about 7 µm. In some embodiments, a width w3 of each protruding pattern 454a is not uniform. For example, the width w3 of the protruding pattern 454a gradually increases from the inner surface IS2 of the protruding pattern 454a toward the outer surface OS2 of the protruding pattern 454a. However, the disclosure is not limited thereto. In some alternative embodiments, the width w3 of each protruding pattern 454a is uniform. In some embodiments, the width w3 of each protruding pattern 454a ranges from about 5 µm to about 15 µm.

Figure 12:
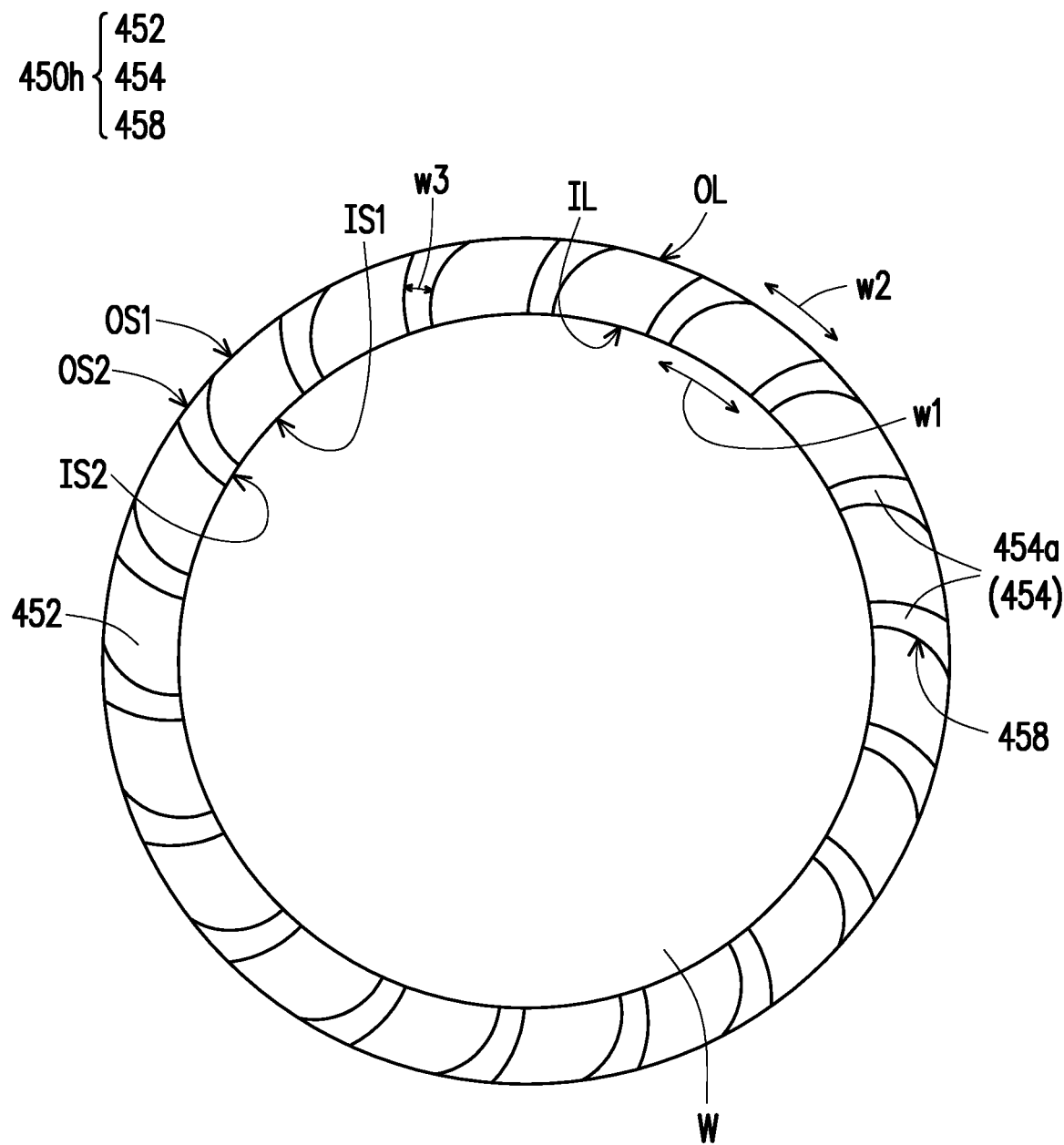
FIG. 12 is a schematic bottom view of a semiconductor workpiece and a clamp ring in accordance with some alternative embodiments of the disclosure.

FIG. 12 is a schematic bottom view of a semiconductor workpiece W and a clamp ring 450h in accordance with some alternative embodiments of the disclosure. Referring to FIG. 12, the semiconductor workpiece W and the clamp ring 450h in FIG. 12 are respectively similar to the semiconductor workpiece W and the clamp ring 450e in FIG. 9A to FIG. 9C, so similar elements are denoted by the same reference numeral and the detailed descriptions thereof are omitted herein. However, in the clamp ring 450h of FIG. 10, each channel 458 is curved along a clockwise direction from the bottom view. In some embodiments, when the semiconductor workpiece W is spun along the clockwise direction, the arrangement of the channels 458 may further aid the air bubbles to travel from the inner surface IS to the outer surface OS of the clamp ring 450h rapidly.

Figure 13A:
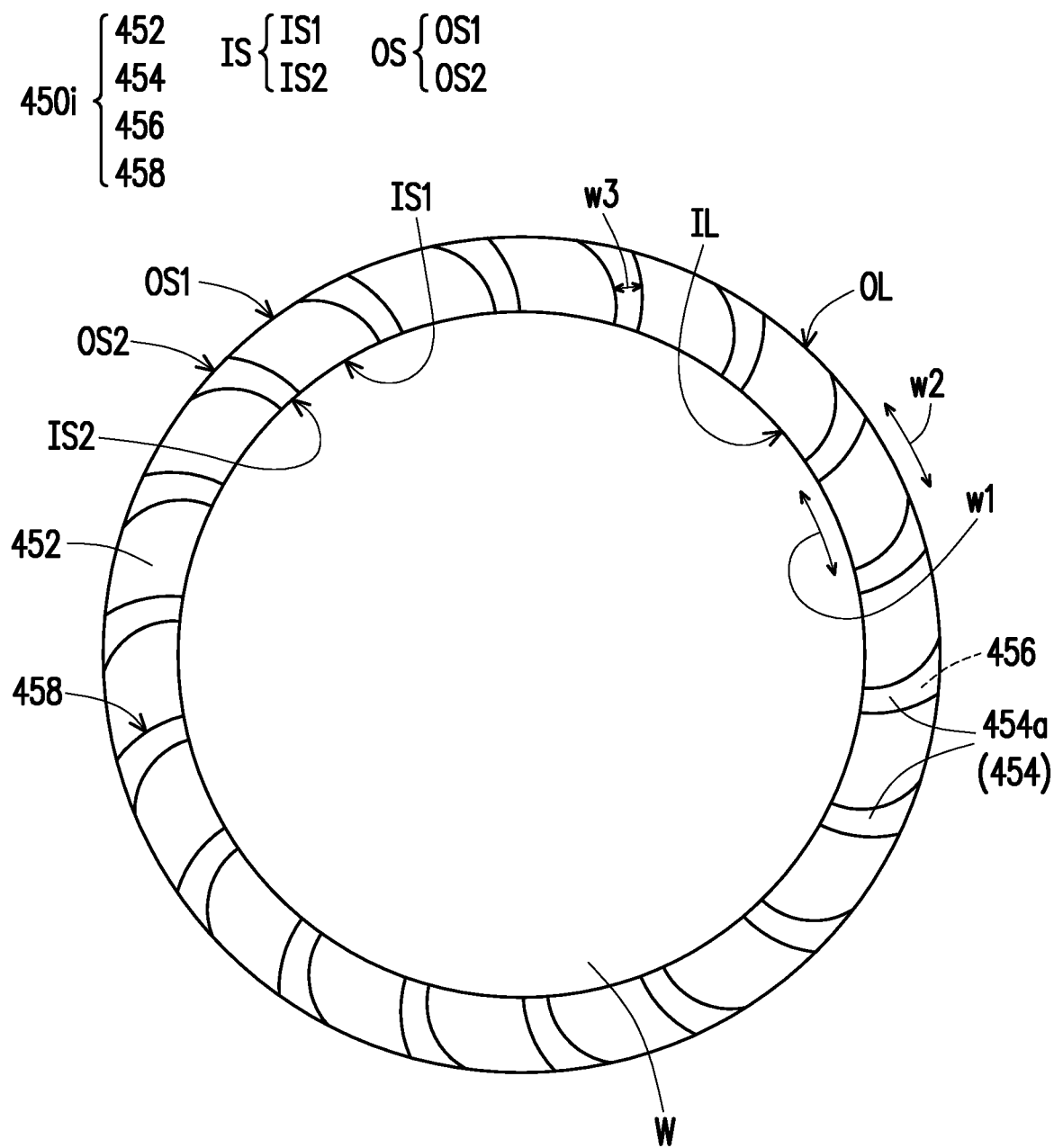
FIG. 13A is a schematic bottom view of a semiconductor workpiece and a clamp ring in accordance with some alternative embodiments of the disclosure.
Figure 13B:
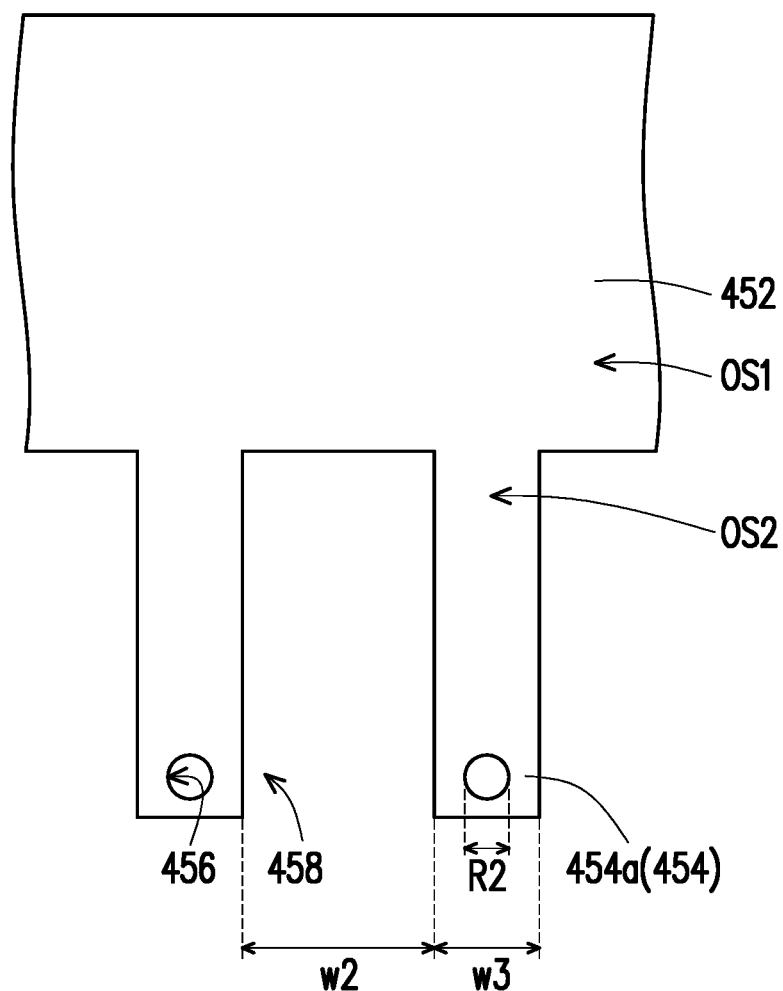
FIG. 13B is a partial side view of the clamp ring in accordance with some alternative embodiments of the disclosure.

FIG. 13A is a schematic bottom view of a semiconductor workpiece W and a clamp ring 450i in accordance with some alternative embodiments of the disclosure. FIG. 13B is a partial side view of the clamp ring 450i in accordance with some alternative embodiments of the disclosure. Referring to FIG. 13A and FIG. 13B, the semiconductor workpiece W and the clamp ring 450i in FIG. 13A and FIG. 13B are respectively similar to the semiconductor workpiece W and the clamp ring 450e in FIG. 9A to FIG. 9C, so similar elements are denoted by the same reference numeral and the detailed descriptions thereof are omitted herein. However, the clamp ring 450i in FIG. 13A and FIG. 13B further includes a plurality of channels 456. In some embodiments, the channels 456 of the clamp ring 450i in FIG. 13A and FIG. 13B are similar to the channels 456 of the clamp ring 450 in FIG. 4A to FIG. 4C, so the detailed descriptions thereof are omitted herein. As illustrated in FIG. 13B, the channels 456 penetrate through the protruding patterns 454a of the protruding portion 454. In some embodiments, each protruding pattern 454a correspond to one channel 456. However, the disclosure is not limited thereto. In some alternative embodiments, multiple channels 456 may penetrate through a same protruding pattern 454a. Since the channels 456 and the channels 458 communicate the inner surface IS and the outer surface OS of the clamp ring 450i, the channels 456 and the channels 458 may serve as discharging mechanisms for the air bubbles trapped on the bottom surface $BS_W$ of the semiconductor workpiece W during the plating process 30. In some embodiments, the undesired air bubbles on the bottom surface $BS_W$ of the semiconductor workpiece W can be expelled through the channels 456 and the channels 458 of the clamp ring 450i. As such, the plating quality may be sufficiently enhanced.

In accordance with some embodiments of the disclosure, a plating apparatus includes a workpiece holder, a plating bath, and a clamp ring. The plating bath is underneath the workpiece holder. The clamp ring is connected to the workpiece holder. The clamp ring includes channels communicating an inner surface of the clamp ring and an outer surface of the clamp ring.

In accordance with some alternative embodiments of the disclosure, a plating apparatus for plating a semiconductor wafer includes a wafer holder, a plating bath, and a clamp ring. The plating bath is underneath the wafer holder. The clamp ring is connected to the wafer holder. The clamp ring includes a body portion, a protruding portion connected to the body portion, and vents. The protruding portion covers a portion of a bottom surface of the semiconductor wafer and has an inclined inner surface. The vents are located below the bottom surface of the semiconductor wafer. The vents has inlets and outlets, and the inlets are closer to the semiconductor wafer than the outlets.

In accordance with some embodiments of the disclosure, a plating method includes at least the following steps. A semiconductor workpiece is placed on a workpiece holder. The semiconductor workpiece is fixed to the workpiece holder by a clamp ring. The clamp ring is connected to the workpiece holder. The clamp ring includes channels communicating an inner surface of the clamp ring and an outer surface of the clamp ring. The semiconductor workpiece is tilted to a first angle. The semiconductor workpiece is immersed into a plating solution within a plating bath and the semiconductor workpiece is tilted to a second angle. The semiconductor workpiece is plated.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A plating apparatus, comprising:
a workpiece holder;
a plating bath underneath the workpiece holder; and
a clamp ring connected to the workpiece holder, wherein the clamp ring comprises first vents communicating an inner surface of the clamp ring and an outer surface of the clamp ring, wherein the clamp ring comprises a body portion and a protruding portion protruding from a bottom surface of the body portion, and the first vents penetrate through the protruding portion, the protruding portion comprises a plurality of protruding patterns disconnected from one another, and each of the first vents is defined by two adjacent protruding patterns and the bottom surface of the body portion.

2. The plating apparatus of claim 1, wherein the clamp ring further comprises second vents communicating the inner surface of the clamp ring and the outer surface of the clamp ring, each of the second vents has a first end located at the inner surface of the clamp ring and a second end located at the outer surface of the clamp ring, and a size of the first end is equal to a size of the second end.

3. The plating apparatus of claim 1, wherein the clamp ring further comprises second vents communicating the inner surface of the clamp ring and the outer surface of the clamp ring, each of the second vents has a first end located at the inner surface of the clamp ring and a second end located at the outer surface of the clamp ring, and a size of the first end is different from a size of the second end.

4. The plating apparatus of claim 2, wherein the second vents penetrate through the protruding patterns.

5. The plating apparatus of claim 3, wherein the second vents penetrate through the protruding patterns.

6. The plating apparatus of claim 2, wherein each of the second vents is curved along a clockwise direction or a counterclockwise direction from a bottom view.

7. The plating apparatus of claim 3, wherein each of the second vents is curved along a clockwise direction or a counterclockwise direction from a bottom view.

8. The plating apparatus of claim 1, wherein a size of a first end of each of the first vents is equal to a size of a second end each of the first vents.

9. The plating apparatus of claim 1, wherein each of the first vents is curved along a clockwise direction from a bottom view.

10. The plating apparatus of claim 1, wherein each of the first vents is curved along a counterclockwise direction from a bottom view.

11. The plating apparatus of claim 1, further comprising:
a rotating mechanism connected to the workpiece holder;
a connector connected to the rotating mechanism; and
a tilting mechanism connected to the rotating mechanism through the connector.

12. A plating apparatus for plating a semiconductor wafer, comprising:
a wafer holder;
a plating bath underneath the wafer holder; and
a clamp ring connected to the wafer holder, wherein the clamp ring comprises a body portion, a protruding portion connected to the body portion, first vents and second vents, the protruding portion covers a first portion of a bottom surface of the semiconductor wafer and has an inclined inner surface, the first vents and the second vents are located below the bottom surface of the semiconductor wafer, the second vents has inlets and outlets, and the inlets are closer to the semiconductor wafer than the outlets, the protruding portion comprises a plurality of protruding patterns disconnected from one another, and two adjacent protruding patterns are spaced apart by each of the first vents.

13. The plating apparatus of claim 12, wherein the inlets of the second vents are located on the inclined inner surface of the protruding portion.

14. The plating apparatus of claim 12, wherein a top surface of the protruding portion is coplanar with the bottom surface of the semiconductor wafer.

15. The plating apparatus of claim 12, wherein an outer surface of the body portion is aligned with an outer surface of the protruding portion, the inclined inner surface of the protruding portion is connected to the outer surface of the protruding portion, and the outlets of the second vents are located on the outer surface of the protruding portion.

16. The plating apparatus of claim 12, wherein the body portion covers a lateral surface of the semiconductor wafer.

17. A plating method, comprising:
placing a semiconductor workpiece on a workpiece holder;
fixing the semiconductor workpiece to the workpiece holder by a clamp ring, wherein the clamp ring is connected to the workpiece holder, and the clamp ring comprise vents communicating an inner surface of the clamp ring and an outer surface of the clamp ring, wherein the clamp ring comprises a body portion and a protruding portion protruding from a bottom surface of the body portion, and the vents penetrate through the protruding portion, the protruding portion comprises a plurality of protruding patterns disconnected from one another, and each of the vents is defined by two adjacent protruding patterns and the bottom surface of the body portion;
tilting the semiconductor workpiece to a first angle;
immersing the semiconductor workpiece into a plating solution within a plating bath and tilting the semiconductor workpiece to a second angle; and
plating the semiconductor workpiece.

18. The method of claim 17, wherein the first angle is 3° with respect to a fluid level of the plating solution and the second angle is 0° with respect to the fluid level of the plating solution.

19. The method of claim 17, wherein the semiconductor workpiece is tilted to the second angle after being immersed into the plating solution.

20. The method of claim 17, wherein air bubbles are generated during the immersion of the semiconductor workpiece into the plating solution, and the air bubbles are removed through the channels of the clamp ring by spinning the semiconductor workpiece before the semiconductor workpiece is plated.

* * * * *